(12) United States Patent
Tseng et al.

(10) Patent No.: US 9,570,179 B2
(45) Date of Patent: Feb. 14, 2017

(54) NON-VOLATILE MEMORY WITH TWO PHASED PROGRAMMING

(71) Applicant: SanDisk Technologies Inc., Plano, TX (US)

(72) Inventors: Huai-Yuan Tseng, San Ramon, CA (US); Deepanshu Dutta, Fremont, CA (US)

(73) Assignee: SANDISK TECHNOLOGIES LLC, Plano, TX (US)

( * ) Notice: Subject to any disclaimer, the term of this patent is extended or adjusted under 35 U.S.C. 154(b) by 0 days.

(21) Appl. No.: 14/841,182

(22) Filed: Aug. 31, 2015

(65) Prior Publication Data

US 2016/0314843 A1 Oct. 27, 2016

Related U.S. Application Data

(60) Provisional application No. 62/150,972, filed on Apr. 22, 2015.

(51) Int. Cl.
| | |
|---|---|
| *G11C 16/06* | (2006.01) |
| *G11C 16/10* | (2006.01) |
| *G11C 11/56* | (2006.01) |
| *G11C 16/34* | (2006.01) |
| *G11C 16/32* | (2006.01) |
| *G11C 16/26* | (2006.01) |

(52) U.S. Cl.
CPC ............ *G11C 16/10* (2013.01); *G11C 11/5671* (2013.01); *G11C 16/26* (2013.01); *G11C 16/32* (2013.01); *G11C 16/3459* (2013.01)

(58) Field of Classification Search
CPC .................................................. G11C 16/3459

USPC .................................................... 365/185.22
See application file for complete search history.

(56) References Cited

U.S. PATENT DOCUMENTS

| | | |
|---|---|---|
| 5,339,274 A | 8/1994 | Dhong et al. |
| 6,141,244 A | 10/2000 | Pawletko et al. |
| 6,643,188 B2 | 11/2003 | Tanaka et al. |
| 6,888,758 B1 | 5/2005 | Hemink |
| 7,020,026 B2 | 3/2006 | Guterman et al. |
| 7,073,103 B2 | 7/2006 | Gongwer et al. |
| 7,139,198 B2 | 11/2006 | Guterman et al. |
| 7,257,028 B2 | 8/2007 | Lee et al. |
| 7,310,255 B2 | 12/2007 | Chan |
| 7,454,324 B1 | 11/2008 | Seawright et al. |
| 7,471,567 B1 | 12/2008 | Lee et al. |

(Continued)

*Primary Examiner* — Son Mai
(74) *Attorney, Agent, or Firm* — Vierra Magen Marcus LLP

(57) ABSTRACT

Programming non-volatile memory includes applying a series of programming pulses to the memory cells as part of a coarse/fine programming process. Between programming pulses, memory cells in the coarse phase are verified for a coarse phase verify level for a target data state and memory cells in the fine phase are verified for a fine phase verify level for the target data state, both in response to a single reference voltage applied on a common word line. For a memory cell in the coarse phase that has been verified to have reached the coarse phase verify level, the memory cell will be temporarily inhibited from programming for a next programming pulse and switched to the fine phase. For a memory cell in the fine phase that has been verified to have reached the fine phase verify level, the memory cell will be inhibited from further programming.

21 Claims, 22 Drawing Sheets

(56) References Cited

U.S. PATENT DOCUMENTS

| | | | |
|---|---|---|---|
| 7,508,715 B2 | 3/2009 | Lee | |
| 7,551,477 B2 | 6/2009 | Mokhlesi et al. | |
| 7,599,224 B2 * | 10/2009 | Lee | G11C 11/5628 |
| | | | 365/185.17 |
| 7,616,500 B2 | 11/2009 | Mokhlesi | |
| 7,800,094 B2 | 9/2010 | Ho et al. | |
| 7,800,945 B2 | 9/2010 | Cernea | |
| 7,826,271 B2 | 11/2010 | Cernea | |
| 8,218,381 B2 | 7/2012 | Li | |
| 8,223,556 B2 | 7/2012 | Dutta et al. | |
| 8,582,381 B2 | 11/2013 | Oowada et al. | |
| 8,885,416 B2 | 11/2014 | Mui et al. | |
| 2004/0109362 A1 | 6/2004 | Gongwer et al. | |
| 2008/0247254 A1 | 10/2008 | Nguyen et al. | |
| 2012/0188824 A1 * | 7/2012 | Chen | G11C 11/5628 |
| | | | 365/185.19 |
| 2012/0236654 A1 * | 9/2012 | Hemink | G11C 11/5628 |
| | | | 365/185.19 |
| 2013/0094294 A1 * | 4/2013 | Kwak | H01L 27/1157 |
| | | | 365/185.03 |
| 2015/0103595 A1 | 4/2015 | Dunga et al. | |
| 2015/0221376 A1 * | 8/2015 | Choi | G11C 16/10 |
| | | | 365/185.11 |

* cited by examiner

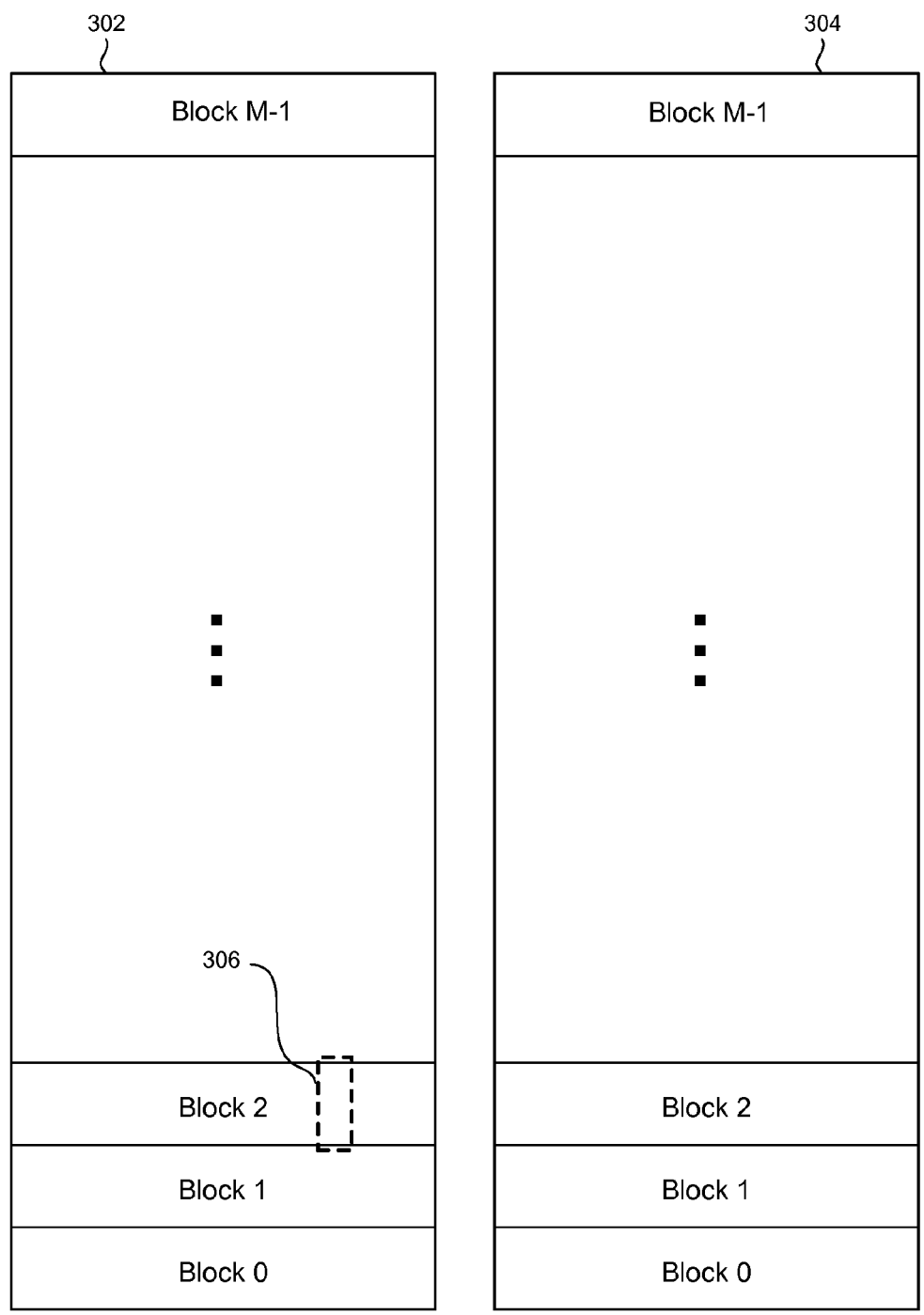

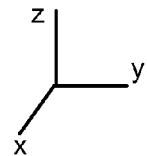
Figure 4D
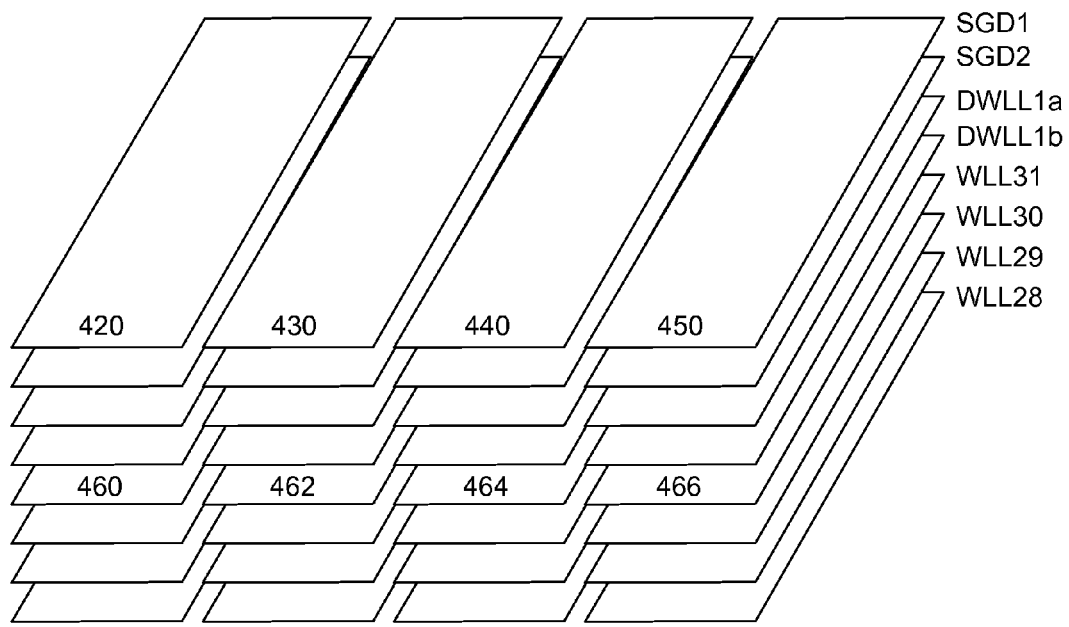
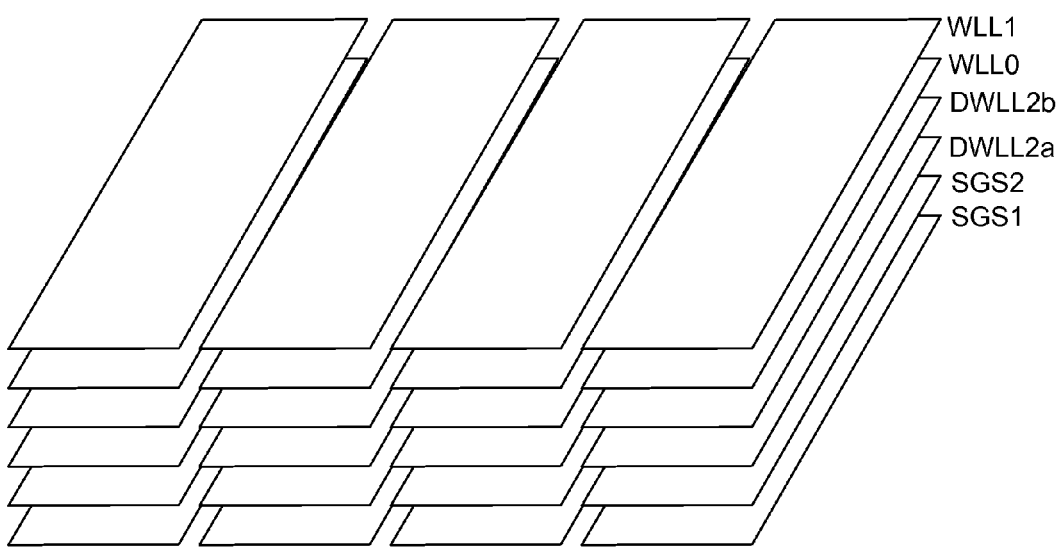

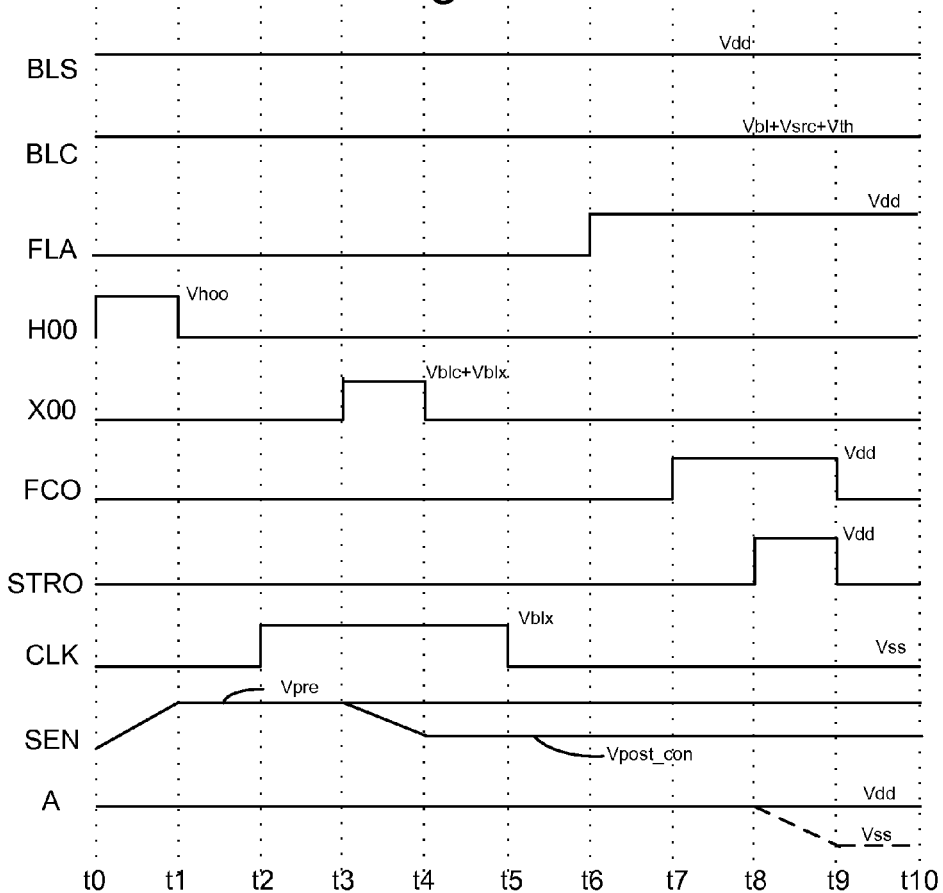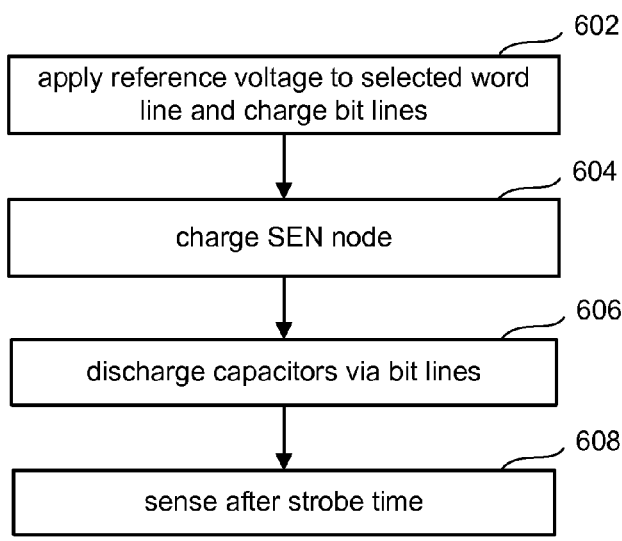

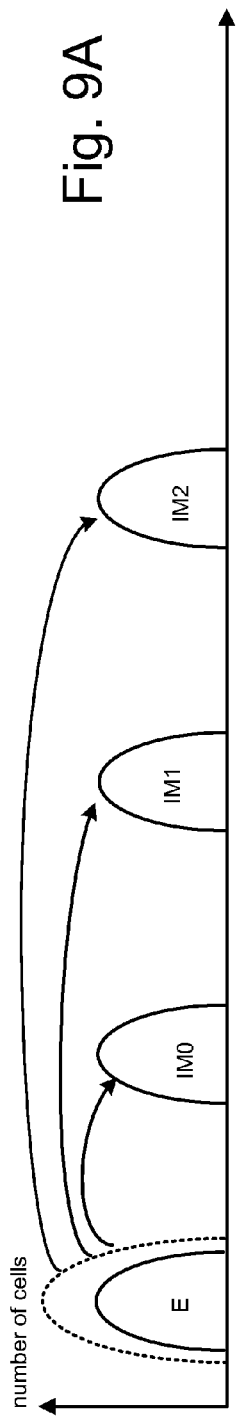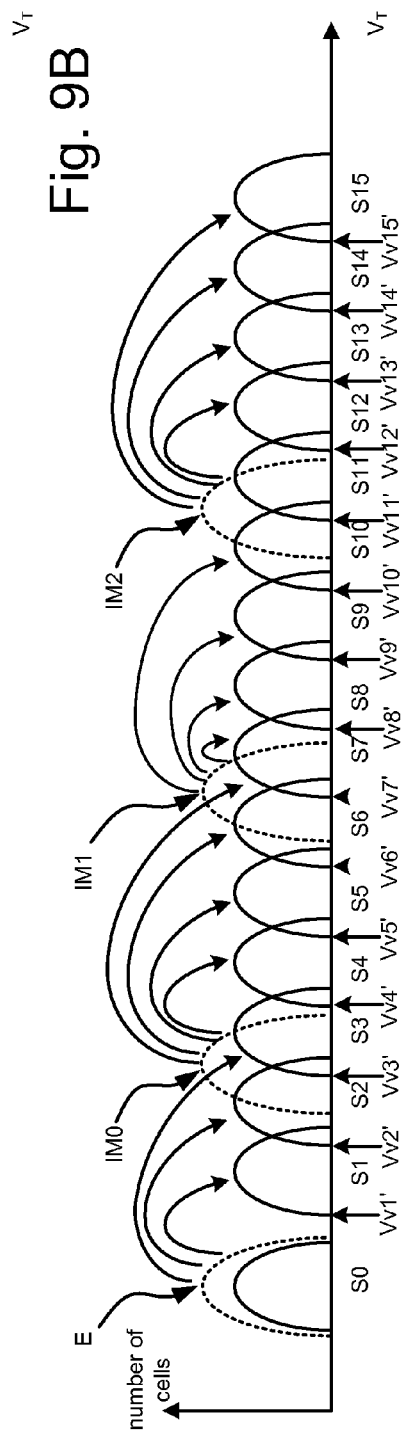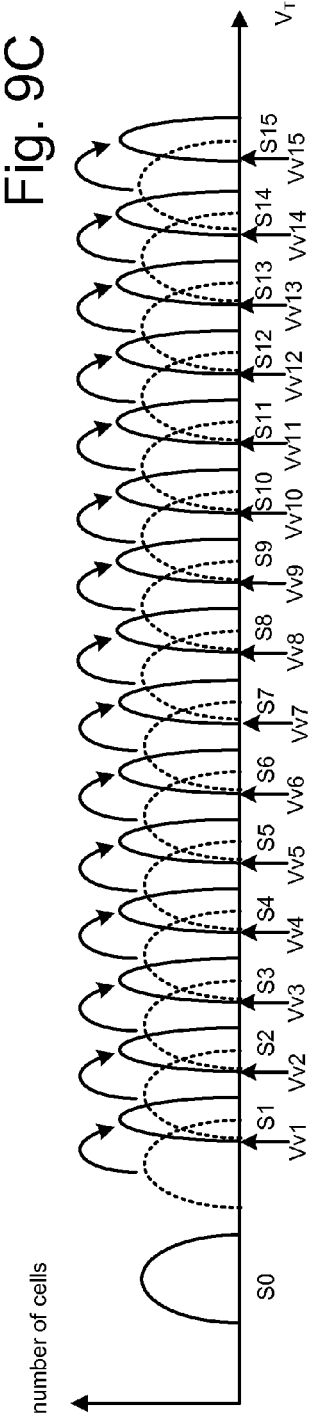

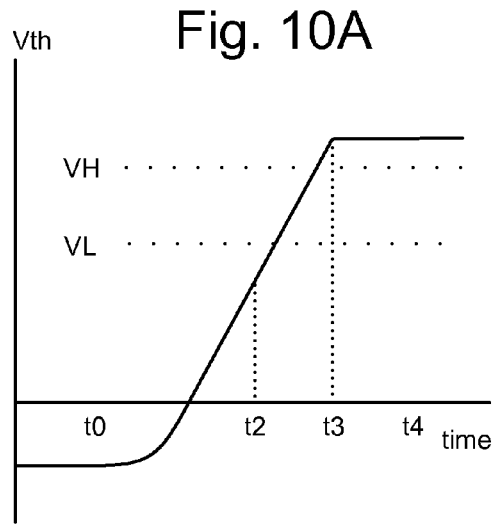
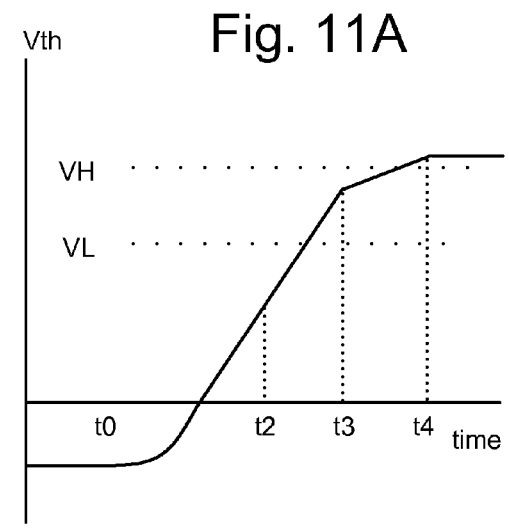
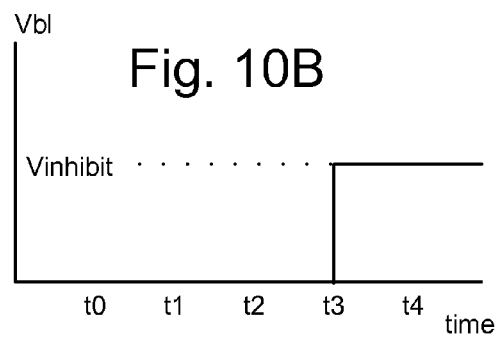
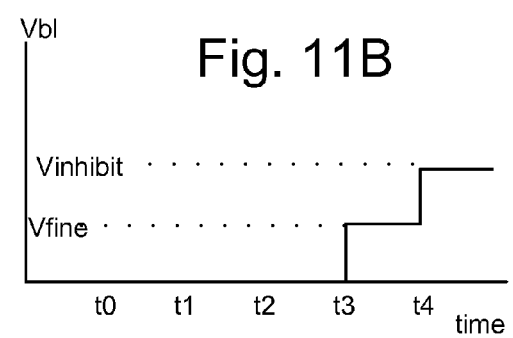
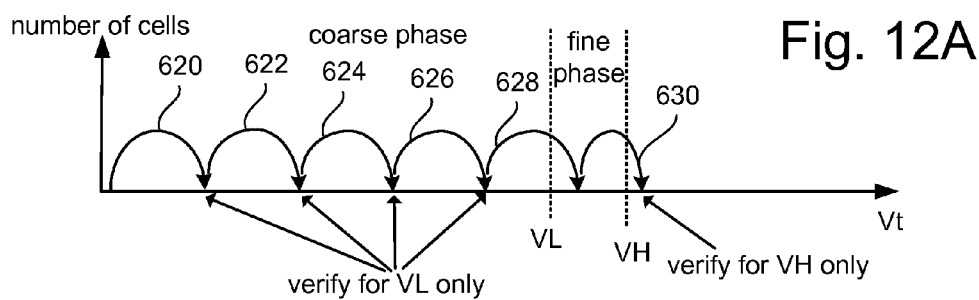

Fig. 21A

| VPGM Pulse # | VBLC (program) | VBLC (verify) | Verify result |
|---|---|---|---|
| 1 | Vcoarse | VBLC_VL | FAIL |
| 2 | Vcoarse | VBLC_VL | FAIL |
| ………. | ………. | ………. | ………. |
| ………. | ………. | ………. | ………. |
| N-1 | Vcoarse | VBLC_VL | FAIL |
| N | Vcoarse | VBLC_VL | PASS |
| N+1 | Vinhibit | VBLC_VH | FAIL |
| N+2 | Vfine | VBLC_VH | FAIL |
| ………. | ………. | ………. | ………. |
| M | Vfine | VBLC_VH | PASS |
| M+1 | Vinhibit | xx | xx |
| ………. | ………. | ………. | ………. |

Fig. 21B

| VPGM Pulse # | VBLC (program) | VBLC (verify) | Verify result |
|---|---|---|---|
| 1 | Vcoarse | VBLC_VL | FAIL |
| 2 | Vcoarse | VBLC_VL | FAIL |
| ………. | ………. | ………. | ………. |
| ………. | ………. | ………. | ………. |
| N-1 | Vcoarse | VBLC_VL | FAIL |
| N | Vcoarse | VBLC_VL | PASS |
| N+1 | Vinhibit | VBLC_VH | PASS |
| N+2 | Vinhibit | xx | xx |
| ………. | ………. | ………. | ………. |

Fig. 21C

| VPGM Pulse # | VBLC (program) | VBLC (verify) | Verify result |
|---|---|---|---|
| 1 | Vcoarse | VBLC_VL | FAIL |
| 2 | Vcoarse | VBLC_VL | FAIL |
| ......... | ......... | ......... | ......... |
| ......... | ......... | ......... | ......... |
| N-1 | Vcoarse | VBLC_VL | FAIL |
| N | Vcoarse | VBLC_VL | PASS |
| N+1 | Vfine | VBLC_VH | FAIL |
| N+2 | Vfine | VBLC_VH | FAIL |
| ......... | ......... | ......... | ......... |
| M | Vfine | VBLC_VH | PASS |
| M+1 | Vinhibit | xx | xx |
| ......... | ......... | ......... | ......... |

Fig. 21D

| VPGM Pulse # | VBLC (program) | VBLC (verify) | Verify result |
|---|---|---|---|
| 1 | Vcoarse | VBLC_VL | FAIL |
| 2 | Vcoarse | VBLC_VL | FAIL |
| ......... | ......... | ......... | ......... |
| ......... | ......... | ......... | ......... |
| N-1 | Vcoarse | VBLC_VL | FAIL |
| N | Vcoarse | VBLC_VL | PASS |
| N+1 | Vfine | VBLC_VH | PASS |
| N+2 | Vinhibit | xx | xx |
| ......... | ......... | ......... | ......... |

NON-VOLATILE MEMORY WITH TWO PHASED PROGRAMMING

This application claims the benefit of U.S. Provisional Application 62/150,972, filed Apr. 22, 2015, titled "Programming Non-Volatile Memory."

BACKGROUND

Semiconductor memory is widely used in various electronic devices such as cellular telephones, digital cameras, personal digital assistants, medical electronics, mobile computing devices, and non-mobile computing devices. Semiconductor memory may comprise non-volatile memory or volatile memory. A non-volatile memory allows information to be stored and retained even when the non-volatile memory is not connected to a source of power (e.g., a battery). Examples of non-volatile memory include flash memory (e.g., NAND-type and NOR-type flash memory) and Electrically Erasable Programmable Read-Only Memory (EEPROM).

A charge-trapping material can be used in non-volatile memory devices to store a charge which can correlate to a data state. The charge-trapping material can be arranged vertically in a three-dimensional (3D) stacked memory structure. One example of a 3D memory structure is the Bit Cost Scalable (BiCS) architecture which comprises a stack of alternating conductive and dielectric layers. A memory hole is formed in the stack and a NAND string is then formed by filling the memory hole with materials including a charge-trapping layer to create a vertical column of memory cells. Control gates of the memory cells are provided by the conductive layers. The threshold voltage (Vt) of the memory is controlled by the amount of charge that is retained in the charge-trapping material. That is, the minimum amount of voltage that must be applied to the control gate before the memory cell is turned on to permit conduction between its source and drain is controlled by the level of charge retained in the charge-trapping material. As such, the threshold voltage is used to an indicator of the data being stored by a memory cell.

Some non-volatile memory devices are used to store two ranges of charges and, therefore, the memory cell can be programmed/erased between two ranges of threshold voltages that correspond to two data states: an erased state (e.g., data "1") and a programmed state (e.g., data "0"). Such a device is referred to as a binary or two-state device.

A multi-state (or multi-level) non-volatile memory is implemented by identifying multiple, distinct allowed ranges of threshold voltages. Each distinct range of threshold voltages corresponds to a data state assigned a predetermined value for the set of data bits. The specific relationship between the data programmed into the memory cell and the ranges of threshold voltages depends upon the data encoding scheme adopted for the memory cells. For example, U.S. Pat. No. 6,222,762 and U.S. Patent Application Publication No. 2004/0255090 both describe various data encoding schemes for multi-state flash memory cells. While multi-state non-volatile memory can store more data than binary non-volatile memory, the process for programming and verifying the programming can take longer for multi-state non-volatile memory.

BRIEF DESCRIPTION OF THE DRAWINGS

Like-numbered elements refer to common components in the different figures.

FIG. 4A is a block diagram of a memory structure having two planes.

FIG. 4D depicts a view of the select gate layers and word line layers.

FIG. 6 is a timing diagram that describes the behavior of certain signals depicted in the sense amplifier of FIG. 5.

FIG. 7 is a flow chart describing one embodiment of the operation of the circuit of FIG. 5.

FIGS. 9A, 9B and 9C depict threshold voltage distributions.

FIGS. 10A, 10B, 11A and 11B are graphs that describe one embodiment of coarse/fine programming.

FIG. 12A depicts the proposed sequence of operation for a memory cell implementing the proposed technology.

FIGS. 21A-D are tables that explain the behavior of example memory cells.

DETAILED DESCRIPTION

In general, the more data states implemented in a multi-state non-volatile memory, the longer it takes to verify programming. Furthermore, the use of a coarse/fine programming methodology provides for more accurate programming, but can also increase the time needed for verification. Therefore, technology is disclosed for reducing the time needed to verify during coarse/fine programming for multi-state non-volatile memory.

Programming non-volatile memory includes applying a series of doses of programming to the memory cells as part of a coarse/fine programming process. Between doses of programming, memory cells in the coarse phase are sensed for a coarse phase verify level for a target data state and memory cells in the fine phase are sensed for a fine phase verify level for the target data state, both in response to a single reference voltage applied on a common word line. For a memory cell in the coarse phase that has been verified to have reached the coarse phase verify level, the memory cell will be temporarily inhibited from programming for a subsequent dose of programming and switched to the fine phase. For a memory cell in the fine phase that has been verified to have reached the fine phase verify level, the memory cell will be inhibited from further programming.

The following discussion provides details of one example of a suitable structure for a memory devices that can implement the proposed technology.

Figure 1:
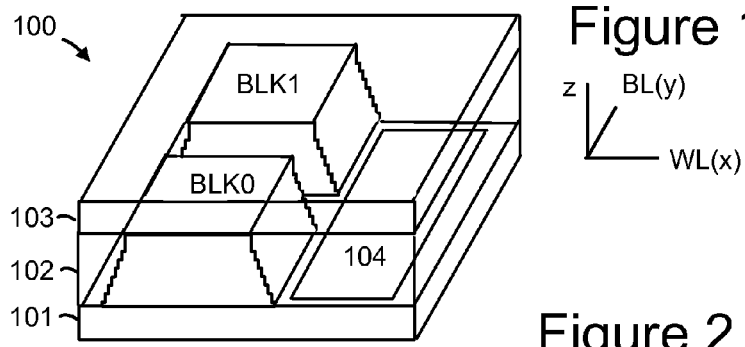
FIG. 1 is a perspective view of a 3D stacked non-volatile memory device.

FIG. 1 is a perspective view of a three dimensional (3D) stacked non-volatile memory device. The memory device 100 includes a substrate 101. On and above the substrate are example blocks BLK0 and BLK1 of memory cells (non-volatile storage elements). Also on substrate 101 is peripheral area 104 with support circuits for use by the blocks. Substrate 101 can also carry circuits under the blocks, along with one or more lower metal layers which are patterned in conductive paths to carry signals of the circuits. The blocks are formed in an intermediate region 102 of the memory device. In an upper region 103 of the memory device, one or more upper metal layers are patterned in conductive paths to carry signals of the circuits. Each block comprises a stacked area of memory cells, where alternating levels of the stack represent word lines. While two blocks are depicted as an example, additional blocks can be used, extending in the x- and/or y-directions.

In one example implementation, the length of the plane in the x-direction, represents a direction in which signal paths for word lines extend (a word line or SGD line direction), and the width of the plane in the y-direction, represents a direction in which signal paths for bit lines extend (a bit line direction). The z-direction represents a height of the memory device.

Figure 2:
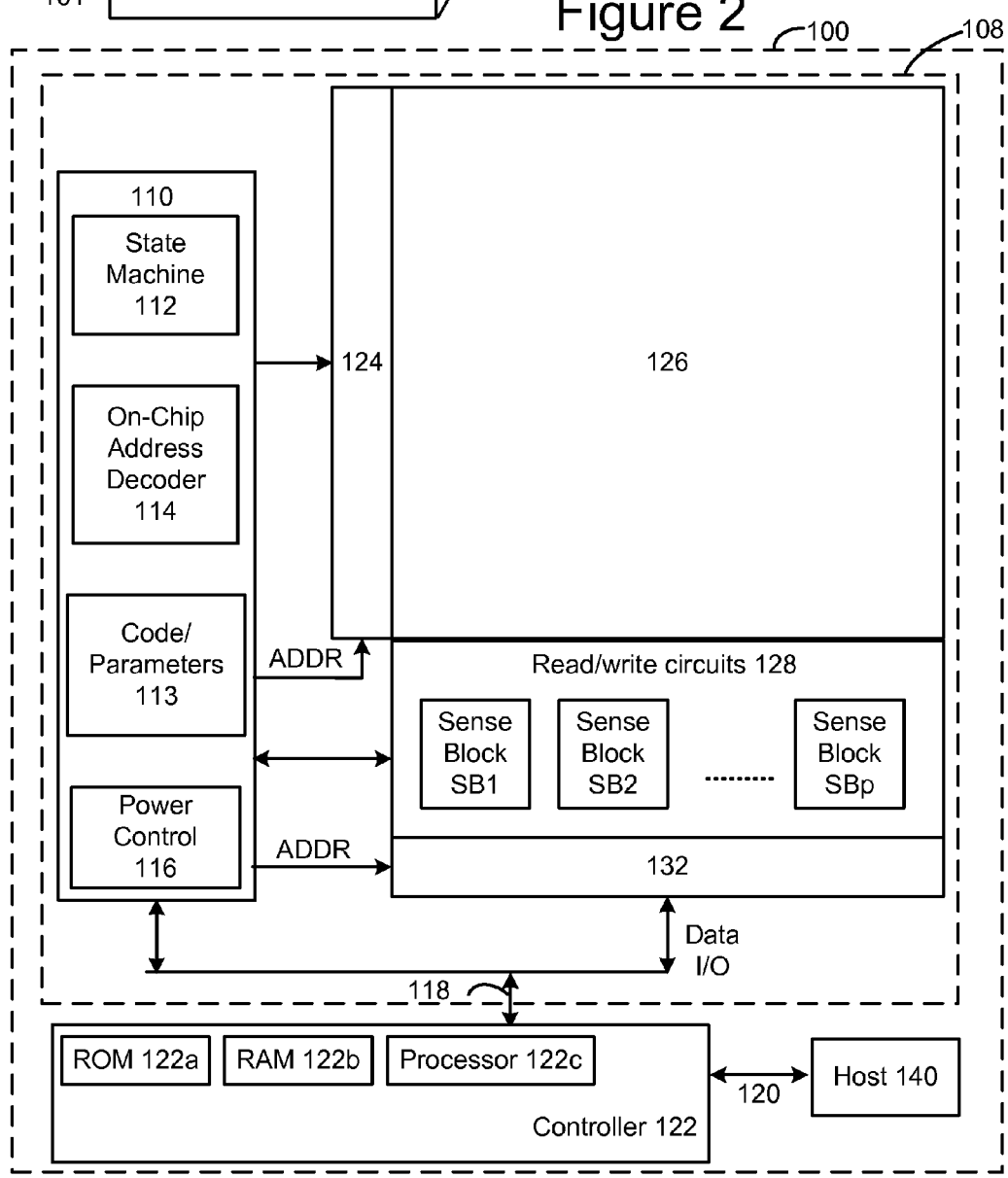
FIG. 2 is a functional block diagram of a memory device such as the 3D stacked non-volatile memory device 100 of FIG. 1.

FIG. 2 is a functional block diagram of an example memory device such as the 3D stacked non-volatile memory device 100 of FIG. 1. The components depicted in FIG. 2 are electrical circuits. Memory device 100 includes one or more memory die 108. Each memory die 108 includes a three dimensional memory structure 126 of memory cells (such as, for example, a 3D array of memory cells), control circuitry 110, and read/write circuits 128. In other embodiments, a two dimensional array of memory cells can be used. Memory structure 126 is addressable by word lines via a row decoder 124 and by bit lines via a column decoder 132. The read/write circuits 128 include multiple sense blocks SB1, SB2, . . . , SBp (sensing circuitry) and allow a page of memory cells to be read or programmed in parallel. In some systems, a controller 122 is included in the same memory device 100 (e.g., a removable storage card) as the one or more memory die 108. However, in other systems, the controller can be separated from the memory die 108. In some embodiments, one controller 122 will communicate with multiple memory die 108. In other embodiments, each memory die 108 has its own controller. Commands and data are transferred between the host 140 and controller 122 via a data bus 120, and between controller 122 and the one or more memory die 108 via lines 118. In one embodiment, memory die 108 includes a set of input and/or output (I/O) pins that connect to lines 118.

Memory structure 126 may comprise one or more arrays of memory cells including a 3D array. The memory structure may comprise a monolithic three dimensional memory structure in which multiple memory levels are formed above (and not in) a single substrate, such as a wafer, with no intervening substrates. The memory structure may comprise any type of non-volatile memory that is monolithically formed in one or more physical levels of arrays of memory cells having an active area disposed above a silicon substrate. The memory structure may be in a non-volatile memory device having circuitry associated with the operation of the memory cells, whether the associated circuitry is above or within the substrate.

Control circuitry 110 cooperates with the read/write circuits 128 to perform memory operations (e.g., erase, program, read, and others) on memory structure 126, and includes a state machine 112, an on-chip address decoder 114, and a power control module 116. The state machine 112 provides chip-level control of memory operations. Code and parameter storage 113 may be provided for storing operational parameters and software. In one embodiment, state machine 112 is programmable by the software stored in code and parameter storage 113. In other embodiments, state machine 112 does not use software and is completely implemented in hardware (e.g., electronic circuits).

The on-chip address decoder 114 provides an address interface between addresses used by host 140 or memory controller 122 to the hardware address used by the decoders 124 and 132. Power control module 116 controls the power and voltages supplied to the word lines and bit lines during memory operations. It can include drivers for word line layers (discussed below) in a 3D configuration, select transistors (e.g., SGS and SGD transistors, described below) and source lines. Power control module 116 may include charge pumps for creating voltages. The sense blocks include bit line drivers. An SGS transistor is a select gate transistor at a source end of a NAND string, and an SGD transistor is a select gate transistor at a drain end of a NAND string.

Any one or any combination of control circuitry 110, state machine 112, decoders 114/124/132, code and parameter storage 113, power control module 116, sense blocks SB1, SB2, . . . , SBp, read/write circuits 128, and controller 122 can be considered one or more control circuits that performs the functions described herein.

The (on-chip or off-chip) controller 122 may comprise a processor 122c and storage devices (memory) such as ROM 122a and RAM 122b. The storage devices comprises code such as a set of instructions, and the processor 122c is operable to execute the set of instructions to provide the functionality described herein. Alternatively or additionally, processor 122c can access code from a storage device in the memory structure, such as a reserved area of memory cells connected to one or more word lines.

Multiple memory elements in memory structure 126 may be configured so that they are connected in series or so that each element is individually accessible. By way of non-limiting example, flash memory devices in a NAND configuration (NAND flash memory) typically contain memory elements connected in series. A NAND string is an example of a set of series-connected memory cells and select gate transistors.

A NAND flash memory array may be configured so that the array is composed of multiple NAND strings of which a NAND string is composed of multiple memory cells sharing a single bit line and accessed as a group. Alternatively, memory elements may be configured so that each element is individually accessible, e.g., a NOR memory array. NAND and NOR memory configurations are exemplary, and memory cells may be otherwise configured.

The memory cells may be arranged in the single memory device level in an ordered array, such as in a plurality of rows and/or columns. However, the memory elements may be arrayed in non-regular or non-orthogonal configurations, or in structures not considered arrays.

A three dimensional memory array is arranged so that memory cells occupy multiple planes or multiple memory device levels, thereby forming a structure in three dimensions (i.e., in the x, y and z directions, where the z direction is substantially perpendicular and the x and y directions are substantially parallel to the major surface of the substrate).

As a non-limiting example, a three dimensional memory structure may be vertically arranged as a stack of multiple two dimensional memory device levels. As another non-limiting example, a three dimensional memory array may be arranged as multiple vertical columns (e.g., columns extending substantially perpendicular to the major surface of the substrate, i.e., in the y direction) with each column having multiple memory cells. The vertical columns may be arranged in a two dimensional configuration, e.g., in an x-y plane, resulting in a three dimensional arrangement of memory cells, with memory cells on multiple vertically stacked memory planes. Other configurations of memory elements in three dimensions can also constitute a three dimensional memory array.

By way of non-limiting example, in a three dimensional NAND memory array, the memory elements may be coupled together to form a vertical NAND string that traverses across multiple horizontal memory device levels. Other three dimensional configurations can be envisioned wherein some NAND strings contain memory elements in a single memory level while other strings contain memory elements which span through multiple memory levels. Three dimensional memory arrays may also be designed in a NOR configuration and in a ReRAM configuration.

A person of ordinary skill in the art will recognize that this technology is not limited to a single specific memory structure, but covers many relevant memory structures within the spirit and scope of the technology as described herein and as understood by one of ordinary skill in the art.

Figure 3A:
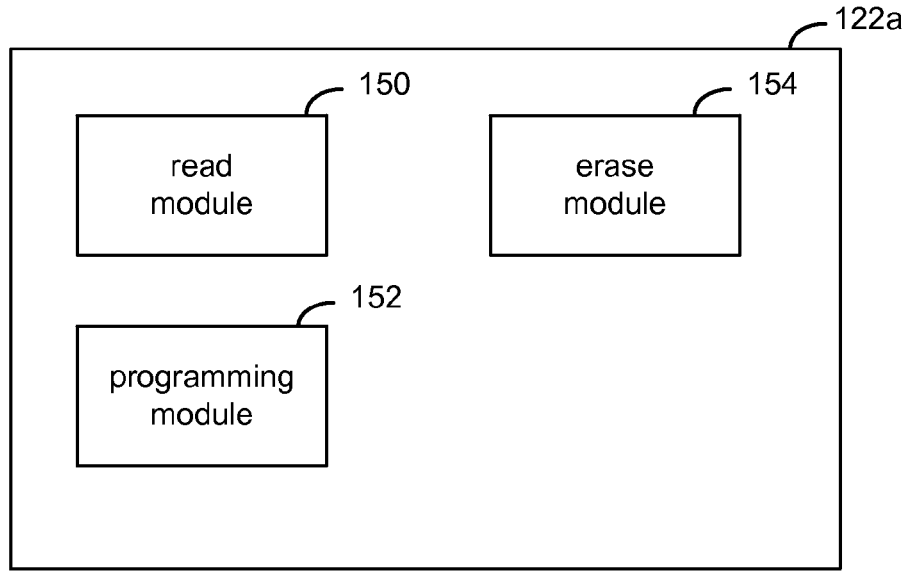
FIG. 3A is a block diagram depicting software modules for programming one or more processors in a Controller.

FIG. 3A is a block diagram depicting software modules for programming one or more processors in controller 122. FIG. 3A depicts read module 150, programming module 152, and erase module 154 being stored in ROM 122a. These software modules can also be stored in RAM or memory die 108. Read module 150 includes software that programs processor(s) 122C to perform read operations. Programming module 152 includes software that programs processor(s) 122C to perform programming operations (including verification of programming) Erase module 154 includes software that programs processor(s) 122C to perform erase operations. Based on the software, controller 122 instructs memory die 108 to perform memory operations.

Figure 3B:
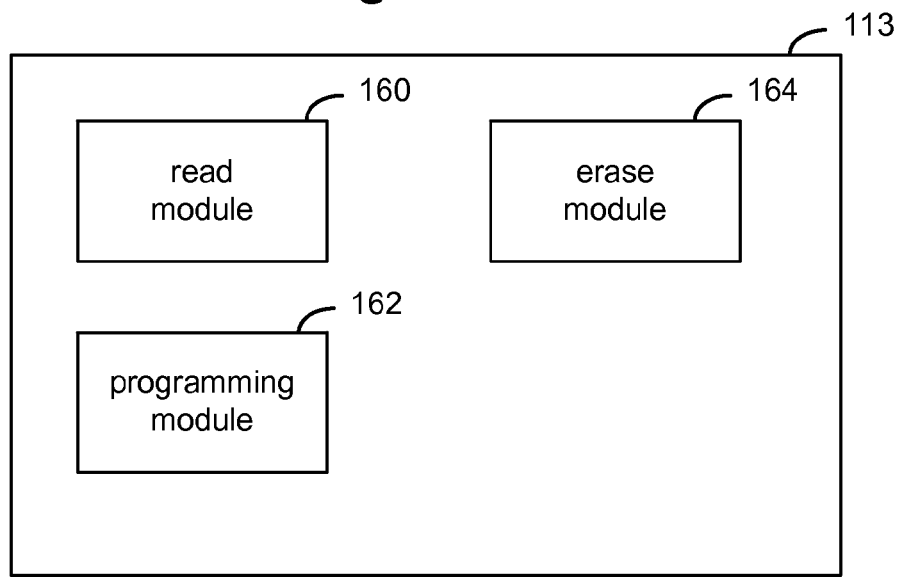
FIG. 3B is a block diagram depicting software modules for programming a state machine or other processor on a memory die.

FIG. 3B is a block diagram depicting software modules for programming state machine 112 (or other processor on memory die 108). FIG. 3B depicts read module 160, programming module 162, and erase module 164 being stored in code and parameter storage 113. These software modules can also be stored in RAM or in memory structure 126. Read module 160 includes software that programs state machine 112 to perform read operations. Programming module 152 includes software that programs state machine 112 to perform programming operations (including verification of programming) Erase module 154 includes software that programs state machine 112 to perform erase operations. Alternatively, state machine 112 (which is an electronic circuit) can be completely implemented with hardware so that no software is needed to perform these functions.

FIG. 4A is a block diagram explaining one example organization of memory structure 126, which is divided into two planes 302 and 304. Each plane is then divided into M blocks. In one example, each plane has about 2000 blocks. However, different numbers of blocks and planes can also be used.

Figure 4B:
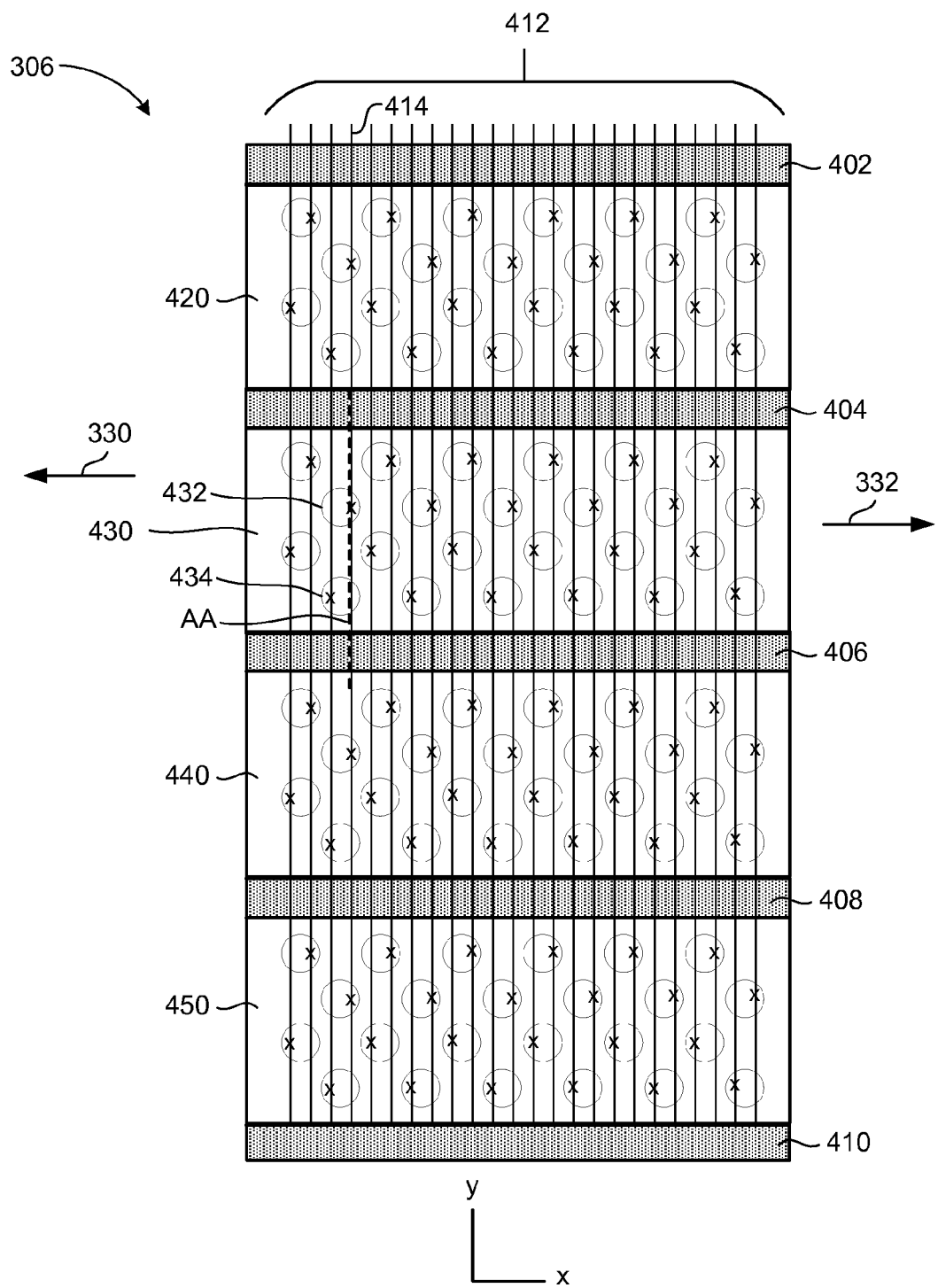
FIG. 4B depicts a top view of a portion of a block of memory cells.

FIG. 4B is a block diagram depicting a top view of a portion of one block from memory structure 126. The portion of the block depicted in FIG. 4B corresponds to portion 306 in block 2 of FIG. 4A. As can be seen from FIG. 4B, the block depicted in FIG. 4B extends in the direction of arrow 330 and in the direction of arrow 332. In one embodiment, the memory array will have 48 layers. Other embodiments have less than or more than 48 layers. However, FIG. 4B only shows the top layer.

FIG. 4B depicts a plurality of circles that represent the vertical columns. Each of the vertical columns include multiple select transistors and multiple memory cells. In one embodiment, each vertical column implements a NAND string. More details of the vertical columns are provided below. Since the block depicted in FIG. 4B extends in the direction of arrow 330 and in the direction of arrow 332, the block includes more vertical columns than depicted in FIG. 4B FIG. 4B also depicts a set of bit lines 412. FIG. 4B shows twenty four bit lines because only a portion of the block is depicted. It is contemplated that more than twenty four bit lines connected to vertical columns of the block. Each of the circles representing vertical columns has an "x" to indicate its connection to one bit line.

The block depicted in FIG. 4B includes a set of local interconnects 402, 404, 406, 408 and 410 that connect the various layers to a source line below the vertical columns. Local interconnects 402, 404, 406, 408 and 410 also serve to divide each layer of the block into four regions; for example, the top layer depicted in FIG. 4B is divided into regions 420, 430, 440 and 450. In the layers of the block that implement memory cells, the four regions are referred to as word line fingers that are separated by the local interconnects. In one embodiment, the word line fingers on a common level of a block connect together at the end of the block to form a single word line. In another embodiment, the word line fingers on the same level are not connected together. In one example implementation, a bit line only connects to one vertical column in each of regions 420, 430, 440 and 450. In that implementation, each block has sixteen rows of active columns and each bit line connects to four rows in each block. In one embodiment, all of four rows connected to a common bit line are connected to the same word line (via different word line fingers on the same level that are connected together); therefore, the system uses the source side select lines and the drain side select lines to choose one (or another subset) of the four to be subjected to a memory operation (program, verify, read, and/or erase).

Although FIG. 4B shows each region having four rows of vertical columns, four regions and sixteen rows of vertical columns in a block, those exact numbers are an example implementation. Other embodiments may include more or less regions per block, more or less rows of vertical columns per region and more or less rows of vertical columns per block.

FIG. 4B also shows the vertical columns being staggered. In other embodiments, different patterns of staggering can be used. In some embodiments, the vertical columns are not staggered.

Figure 4C:
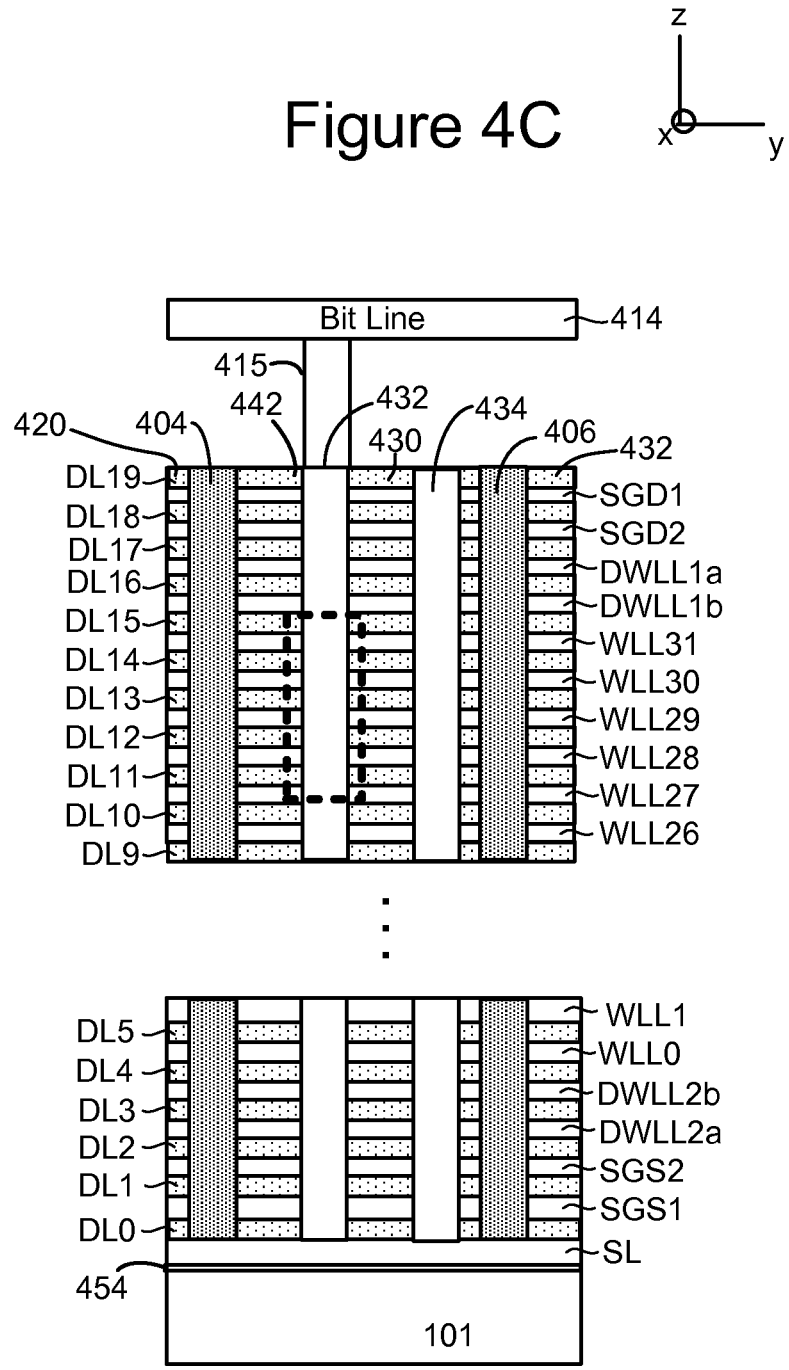
FIG. 4C depicts a cross sectional view of a portion of a block of memory cells.

FIG. 4C depicts a portion of an embodiment of three dimensional memory structure 126 showing a cross-sectional view along line AA of FIG. 4B. This cross sectional view cuts through vertical columns 432 and 434 and region 430 (see FIG. 4B). The structure of FIG. 4C includes two drain side select layers SGD1 and SGD1; two source side select layers SGS1 and SGS2; four dummy word line layers DWLL1a, DWLL1b, DWLL2a and DWLL2b; and thirty two word line layers WLL0-WLL31 for connecting to data memory cells. Other embodiments can implement more or less than two drain side select layers, more or less than two source side select layers, more or less than four dummy word line layers, and more or less than thirty two word line layers. Vertical columns 432 and 434 are depicted protruding through the drain side select layers, source side select layers, dummy word line layers and word line layers. In one embodiment, each vertical column comprises a NAND string. Below the vertical columns and the layers listed below is substrate 101, an insulating film 454 on the substrate, and source line SL. The NAND string of vertical column 432 has a source end at a bottom of the stack and a drain end at a top of the stack. As in agreement with FIG. 4B, FIG. 4C show vertical column 432 connected to Bit Line 414 via connector 415. Local interconnects 404 and 406 are also depicted.

For ease of reference, drain side select layers SGD1 and SGD1; source side select layers SGS1 and SGS2; dummy word line layers DWLL1a, DWLL1b, DWLL2a and DWLL2b; and word line layers WLL0-WLL31 collectively are referred to as the conductive layers. In one embodiment, the conductive layers are made from a combination of TiN and Tungsten. In other embodiments, other materials can be used to form the conductive layers, such as doped polysilicon, metal such as Tungsten or metal silicide. In some embodiments, different conductive layers can be formed from different materials. Between conductive layers are dielectric layers DL0-DL19. For example, dielectric layers DL10 is above word line layer WLL26 and below word line layer WLL27. In one embodiment, the dielectric layers are made from $SiO_2$. In other embodiments, other dielectric materials can be used to form the dielectric layers.

The memory cells are formed along vertical columns which extend through alternating conductive and dielectric layers in the stack. In one embodiment, the memory cells are arranged in NAND strings. The word line layer WLL0-WLL31 connect to memory cells (also called data memory cells). Dummy word line layers DWLL1a, DWLL1b, DWLL2a and DWLL2b connect to dummy memory cells. A dummy memory cell, also referred to as a non-data memory cell, does not store user data, while a data memory cell is eligible to store user data. Thus, data memory cells may be programmed Drain side select layers SGD1 and SGD1 are used to electrically connect and disconnect NAND strings from bit lines. Source side select layers SGS1 and SGS2 are used to electrically connect and disconnect NAND strings from the source line SL.

FIG. 4D depicts a perspective view of the conductive layers (SGD1, SGD1, SGS1, SGS2; DWLL1a, DWLL1b, DWLL2a, DWLL2b, and WLL0-WLL31) for the block that is partially depicted in FIG. 4C. As mentioned above with respect to FIG. 4B, local interconnects 401, 404, 406, 408 and 410 break up each conductive layers into four regions. For example, drain side select gate layer SGD1 (the top layer) is divided into regions 420, 430, 440 and 450. Similarly, word line layer WLL31 is divided into regions 460, 462, 464 and 466. For word line layers (WLL0-WLL31), the regions are referred to as word line fingers; for example, word line layer WLL31 is divided into word line fingers 460, 462, 464 and 466.

Figure 4E:
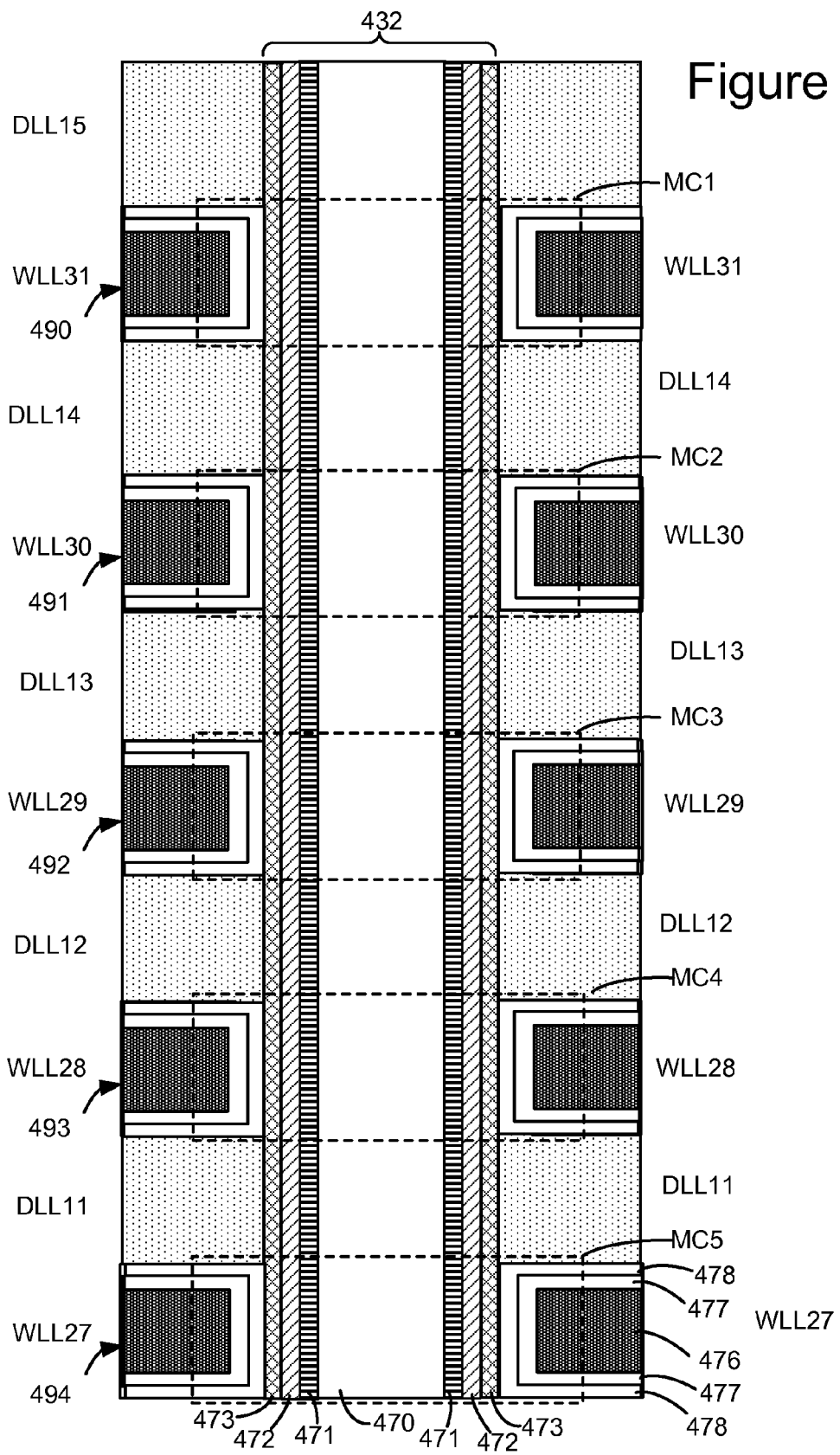
FIG. 4E is a cross sectional view of a vertical column of memory cells.

FIG. 4E depicts a cross sectional view of region 442 of FIG. 4C that includes a portion of vertical column 432. In one embodiment, the vertical columns are round and include four layers; however, in other embodiments more or less than four layers can be included and other shapes can be used. In one embodiment, vertical column 432 includes an inner core layer 470 that is made of a dielectric, such as $SiO_2$. Other materials can also be used. Surrounding inner core 470 is polysilicon channel 471. Materials other than polysilicon can also be used. Note that it is the channel 471 that connects to the bit line. Surrounding channel 471 is a tunneling dielectric 472. In one embodiment, tunneling dielectric 472 has an ONO structure. Surrounding tunneling dielectric 472 is charge trapping layer 473, such as (for example) a specially formulated silicon nitride that increases trap density.

FIG. 4E depicts dielectric layers DLL11, DLL12, DLL13, DLL14 and DLL15, as well as word line layers WLL27, WLL28, WLL29, WLL30, and WLL31. Each of the word line layers includes a word line region 476 surrounded by an aluminum oxide layer 477, which is surrounded by a blocking oxide ($SiO_2$) layer 478. The physical interaction of the word line layers with the vertical column forms the memory cells. Thus, a memory cell, in one embodiment, comprises channel 471, tunneling dielectric 472, charge trapping layer 473, blocking oxide layer 478, aluminum oxide layer 477 and word line region 476. For example, word line layer WLL31 and a portion of vertical column 432 comprise a memory cell MC1. Word line layer WLL30 and a portion of vertical column 432 comprise a memory cell MC2. Word line layer WLL29 and a portion of vertical column 432 comprise a memory cell MC3. Word line layer WLL28 and a portion of vertical column 432 comprise a memory cell MC4. Word line layer WLL27 and a portion of vertical column 432 comprise a memory cell MC5. In other architectures, a memory cell may have a different structure; however, the memory cell would still be the storage unit.

When a memory cell is programmed, electrons are stored in a portion of the charge trapping layer 473 which is associated with the memory cell. These electrons are drawn into the charge trapping layer 473 from the channel 471, through the tunneling layer 473, in response to an appropriate voltage on word line region 476. The threshold voltage (Vth) of a memory cell is increased in proportion to the amount of stored charge. During an erase operation, the electrons return to the channel or holes recombine with electrons.

Figure 5:
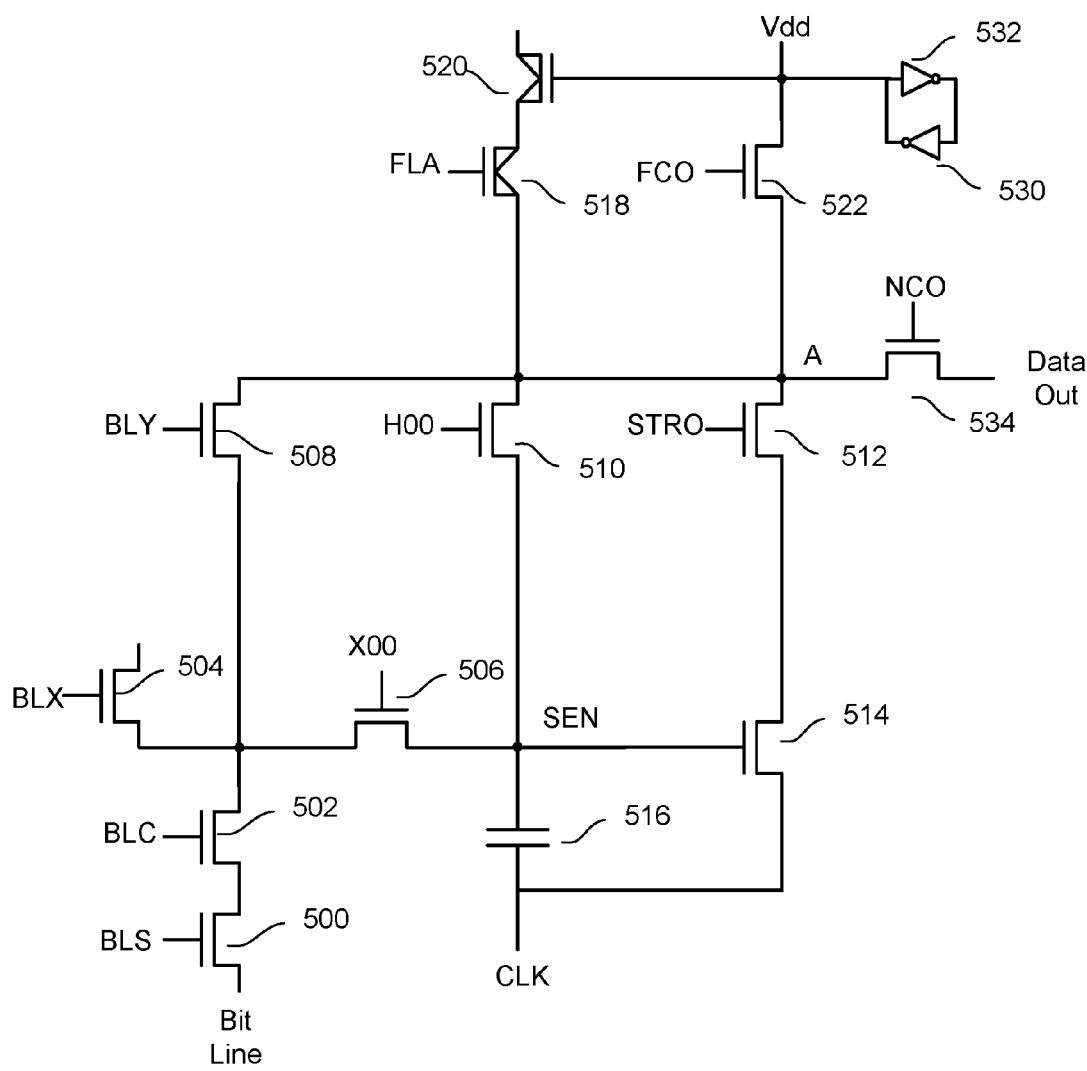
FIG. 5 is a schematic diagram of a sense amplifier.

FIG. 5 is a schematic diagram depicting a sense amplifier circuit. Each sense block SB1, SB2, . . . , SBp (see FIG. 2) includes multiple sense amplifier circuits. As described below, the circuit of FIG. 5 pre-charges a capacitor (or other charge storage device) to a pre-charge magnitude, discharges the capacitor through the memory cell for the duration of a strobe time, and senses voltage at the capacitor after the strobe time. The sense voltage will be indicative of whether the memory cells conducted the current being sensed for, which is indicative of whether the threshold voltage of the memory cell is greater than or less than threshold voltage being tested for. If the threshold voltage of the memory cell is greater than the threshold voltage being tested, then, during a verify operation, the memory cell will complete programming, as appropriate based on the processes described herein. FIG. 5 shows transistor 500 connected to the Bit Line and transistor 502. Transistor 500 receives the signal BLS at its gate, and is used to connect to or isolate the Bit Line. Transistor 502 receives the signal BLC at its gate, and is used as a voltage clamp. The gate voltage BLC is biased at a constant voltage equal to the desired Bit Line voltage plus the threshold voltage of transistor 502. The function of transistor 502, therefore, is to maintain a constant Bit Line voltage during a sensing operation (during read or verify), even if the current through the Bit Line changes.

Transistor 502 is connected to transistors 504, 506 and 508. Transistor 506 is connected to capacitor 516 at the node marked SEN. The purpose of transistor 506 is to connect capacitor 516 to Bit Line 500 and disconnect capacitor 516 from Bit Line 500 so that capacitor 516 is in selective communication with Bit Line 500. In other words, transistor 506 regulates the strobe time. That is, while transistor 506 is turned on capacitor 516 can discharge through the Bit Line, and when transistor 506 is turned off capacitor 516 cannot discharge through the Bit Line.

The node at which transistor 506 connects to capacitor 516 is also connected to transistor 510 and transistor 514. Transistor 510 is connected to transistors 508, 512 and 518. Transistor 518 is also connected to transistor 520. Transistors 518 and 520 are PMOS transistors while the other transistors of FIG. 5 are NMOS transistors. Transistors 510, 518, and 520 provide a pre-charging path to capacitor 516. A voltage (e.g. Vdd or other voltage) is applied to the source of transistor 520. By appropriately biasing transistors 510, 518 and 520, the voltage applied to the source of transistor 520 can be used to pre-charge capacitor 516. After pre-charging, capacitor 516 can discharge through the Bit Line via transistor 506 (assuming that transistors 500 and 502 are conducting).

Although a charge-trapping 3D memory structure embodiment is described above, the technology described herein can apply to other types of 3D memory structures as well as 2D memory structures (including NAND, NOR, and others). For example, the technology described herein can apply to floating gate memories as well.

The circuit of FIG. 5 includes inverters 530 and 532 forming a latch circuit. The output of inverter 532 is connected to the input of inverter 530 and the output of inverter 530 is connected to the input of inverter 532. as well as transistors 520 and 522. The input of inverter 532 will receive Vdd and the two inverters 530, 532 will act as a latch to store Vdd. The input of inverter 532 can also be connected to another value. Transistors 512 and 522 provide a path for communicating the data stored by inverters 530 and 532 to transistor 514. Transistor 522 receives the signal FCO at its gate. Transistor 512 receives the signal STRO at its gate. By raising or lowering FCO and STRO, a path is provided or cut off between the inverters 530, 532 and transistor (sensing switch) 514. The gate of transistor 514 is connected capacitor 516, transistor 506 and transistor 510 at the node marked SEN. The other end of capacitor 516 is connected to the signal CLK.

As discussed above, capacitor 516 is pre-charged via transistors 510, 518 and 520. This will raise the voltage at the SEN node to a pre-charge voltage level (Vpre). When transistor 506 turns on, capacitor 516 can discharge its charge through the Bit Line and the selected memory cell if the threshold voltage of the memory cell is below the voltage level being tested for. If the capacitor 516 is able to discharge, then the voltage at the capacitor (at the SEN node) will decrease.

The pre-charge voltage (Vpre) at the SEN node is greater than the threshold voltage of transistor 914; therefore, prior to the strobe time, transistor 514 is on (conducting). Since transistor 514 is on during the strobe time, then transistor 512 should be off. If the capacitor does not discharge during the strobe time, then the voltage at the SEN node will remain above the threshold voltage of transistor 514 and the charge at the inverters 530, 532 can be discharged into the CLK signal when STRO turns on transistor 512. If the capacitor discharges sufficiently during the strobe time, then the voltage at the SEN node will decrease below the threshold voltage of transistor 514; thereby, turning off transistor 914 and the data (e.g., Vdd) stored at inverters 530, 532 from being discharged through CLK. So testing whether the diodes 530, 532 maintain their charge or discharge will indicate the result of the verification process. In one embodiment, the result can be read at node A via transistor 534 (Data Out) by turning on transistor 534 gate signal NCO.

The pre-charge level of capacitor 516 (and, thus, the pre-charge voltage at node SEN) is limited by the current passing through transistor 510. The current that passes through transistor 510 is limited by the gate voltage H00. As such, the pre-charge voltage at node SEN is limited by the voltage H00 less the threshold voltage of transistor 510. With this arrangement, the system can regulate the pre-charge voltage at node SEN by regulating H00. A larger voltage at H00 results in a larger voltage at the SEN node when pre-charging. A lower voltage at H00 results in a lower voltage at the SEN node when pre-charging.

When the system performs a read or verify operation (both are sense operations), the voltage applied to the control gate of the cell may cause the channel (connected to the bit line) of the cell to conduct. If this happens, a capacitor is discharged through the channel, lowering in voltage as it discharges.

FIG. 6 is a timing diagram describing the behavior of various signals from FIG. 5. The signal BLS is at Vdd the entire time depicted and the signal BLC is at Vb1+Vsrc+Vth, where Vb1 is the voltage of the Bit Line, Vsrc is the voltage of the source line and Vth is the threshold voltage of transistor 502. The signal FLA starts at Vss at t0 and goes to Vdd at t6. When the signal FLA is at Vss, the pre-charging path is regulated by transistor 510. At t0, the voltage of H00 is raised from ground to a pre-charge level. The raising of the voltage at H00 turns on transistor 510 and opens up the pre-charge path. The magnitude of the voltage at H00 is set. FIG. 6 shows H00 going to Vhoo. The signal H00 will stay at the pre-charge voltage (Vhoo) until time t1. While H00 is high, transistor 510 turns on and capacitor 516 will pre-charge between t0 and t1, as depicted by the voltage at SEN. At time t1, H00 is brought down to Vss and the pre-charging is completed.

The signal X00 is used to allow capacitor 516 to be in communication with the Bit Line so that the capacitor can discharge through the Bit Line and selected memory cell. At time t3, X00 is raised to Vb1c+Vb1x, where Vb1c is the voltage of the signal BLC and Vb1x is the voltage of the signal BLX (both discussed above). At time t4, the voltage at X00 is lowered to Vss. Between times t3 and t4, known as the strobe time, capacitor 516 will be in communication with the Bit Line in order to allow it to discharge through the Bit Line and the selected memory cell (depending on the threshold voltage of the selected memory cell). The signal CLK is raised to Vb1x at time t2 and lowered back down to Vss at time t5 to prevent any fighting conditions in the circuit and to allow proper discharge of capacitor 516.

As discussed above, because H00 is raised between t0 and t1, capacitor 516 (and SEN node) will charge up between t0 and t1 (the pre-charge). This is depicted in FIG. 6 with the SEN node charging from Vss to Vpre. The solid line for Vpre represents an example pre-charging of the node SEN (and capacitor 516) in response to Vh00 being applied to the gate of transistor 510.

When X00 is raised up at t3, capacitor 516 can initially pre-charge the bit line and then discharge through the Bit Line (if the threshold voltage is at the appropriate level). As depicted in FIG. 6 between t3 and t4, the voltage at the SEN node can will dissipate from Vpre to Vpost_con if the memory cell turns on (conducts) because its threshold voltage is less than or equal to the voltage being applied to its control gate. If the threshold voltage for the memory cell being tested is higher than the voltage applied to its control gate, capacitor 516 will not discharge and the voltage will remain at Vpre. The period between t3 and t4 is the strobe time and can be adjusted, as described above.

FIG. 6 shows that the signal FCO is raised to Vdd at t7 and lowered to Vss at T9. The signal STRO is raised to Vdd at t8 and lowered at t9. Between times t8 and t9, there is a path between the inverters 530, 532 and transistor 514. If the voltage at the node SEN is greater than the threshold voltage of transistor 514, then there will be a path from the inverters 530, 532 to CLK and the data at the inverters 530, 532 will dissipate through the signal CLK and through the transistor 514. If the voltage at the node SEN is lower than threshold voltage of transistor 514 (e.g. if the capacitor discharged), then transistor 514 will turn off and the voltage stored by the inverters 530, 532 will not dissipate into CLK. FIG. 6 shows the voltage level at node A at Vdd. If the voltage of the capacitor does not dissipate (e.g., due to not enough current flowing because the threshold voltage of the selected memory cell is greater than the voltage being tested for), then transistor 514 will remain on and the voltage at node A will dissipate to Vss (as depicted by the dashed line). If the voltage of the capacitor does dissipate (e.g., due to sufficient current flowing because the threshold voltage of the selected memory cell is below the voltage being tested for), then transistor 514 will turn off and the voltage at node A will remain at Vdd (as depicted by the solid line). The output of node A is provided to the Data Out signal via transistor 534 by applying Vdd to the signal NCO.

FIG. 7 is a flow chart describing a single strobe sensing operation performed according to the timing diagram of FIG. 6. In step 602, the appropriate verify reference voltage (e.g., Vv1, Vv2, Vv3, Vv4, VvS, Vv6, or Vv7—see FIG. 8A) is applied is applied to the selected word line. The selected word line is connected to the memory cells being programmed and verified. The bit lines connected to the memory cells being programmed and verified are charged to a pre-determined pre-charge level. In step 604, all of the SEN nodes are pre-charged. In step 606, capacitors in the sense amplifiers (e.g. capacitor 516) are provided a path to discharge through the memory cells (see SEN node t5-t6 of FIG. 6). After a predetermined time period, referred to as the "strobe time" or "integration time" the voltage of the capacitor 516 (or the SEN node) is sampled as described above to see whether the respective memory cell(s) conducted in step 608. As described above, the verification process is performed simultaneously for thousands of memory cells connected to the same word line and different bit lines.

Figure 8A:
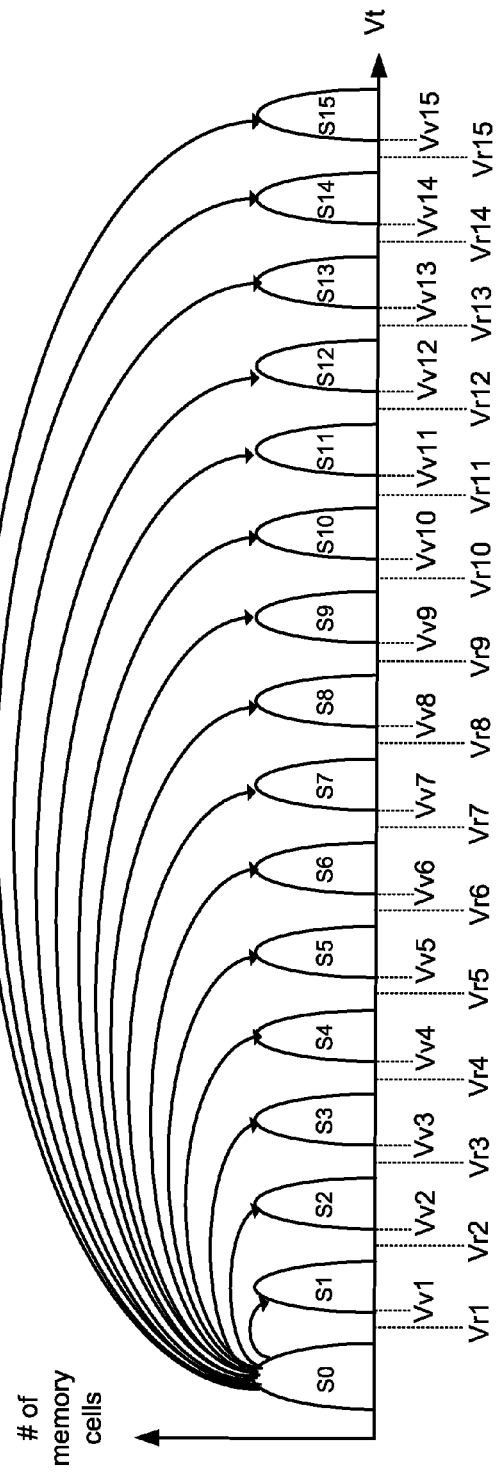
FIGS. 8A and 8B depict threshold voltage distributions.

At the end of a successful programming process (with verification), the threshold voltages of the memory cells should be within one or more distributions of threshold voltages for programmed memory cells or within a distribution of threshold voltages for erased memory cells, as appropriate. FIG. 8A illustrates example threshold voltage distributions for the memory cell array when each memory cell stores four bits of data. Other embodiments, however, may use other data capacities per memory cell (e.g., such as one, two, three, or five bits of data per memory cell). FIG. 8A shows sixteen threshold voltage distributions (corresponding to sixteen data states). The first threshold voltage distribution (data state) S0 represents memory cells that are erased. The other fifteen threshold voltage distributions (data states) S1-S15 represent memory cells that are programmed Each threshold voltage distribution (data state) corresponds to predetermined values for the set of data bits. The specific relationship between the data programmed into the memory cell and the threshold voltage levels of the cell depends upon the data encoding scheme adopted for the cells. In one embodiment, data values are assigned to the threshold voltage ranges using a Gray code assignment so that if the threshold voltage of a floating gate erroneously shifts to its neighboring physical state, only one bit will be affected.

FIG. 8A also shows fifteen read reference voltages, Vr1, Vr2, Vr3, Vr4, Vr5, Vr6, Vr7, Vr8, Vr9, Vr10, Vr11, Vr12, Vr13, Vr14 and Vr15, for reading data from memory cells. By testing whether the threshold voltage of a given memory cell is above or below the fifteen read reference voltages, the system can determine what data state (ie S0, S1, S2, S3, . . . ) the memory cell is in.

FIG. 8A also shows fifteen verify reference voltages, Vv1, Vv2, Vv3, Vv4, Vv5, Vv6, Vv7, Vv8, Vv9, Vv10, Vv11, Vv12, Vv13, Vv14 and Vv15. When programming memory cells to data state S1, the system will test whether those memory cells have a threshold voltage greater than or equal to Vv1. When programming memory cells to data state S2, the system will test whether the memory cells have threshold voltages greater than or equal to Vv2. When programming memory cells to data state S3, the system will determine whether memory cells have their threshold voltage greater than or equal to Vv3. When programming memory cells to data state S4, the system will test whether those memory cells have a threshold voltage greater than or equal to Vv4. When programming memory cells to data state S5, the system will test whether those memory cells have a threshold voltage greater than or equal to Vv4. When programming memory cells to data state S6, the system will test whether those memory cells have a threshold voltage greater than or equal to Vv6. When programming memory cells to data state S7, the system will test whether those memory cells have a threshold voltage greater than or equal to Vv7. When programming memory cells to data state S8, the system will test whether those memory cells have a threshold voltage greater than or equal to Vv8. When programming memory cells to data state S9, the system will test whether those memory cells have a threshold voltage greater than or equal to Vv9. When programming memory cells to data state S10, the system will test whether those memory cells have a threshold voltage greater than or equal to Vv10. When programming memory cells to data state S11, the system will test whether those memory cells have a threshold voltage greater than or equal to Vv11. When programming memory cells to data state S12, the system will test whether those memory cells have a threshold voltage greater than or equal to Vv12. When programming memory cells to data state S13, the system will test whether those memory cells have a threshold voltage greater than or equal to Vv13. When programming memory cells to data state S14, the system will test whether those memory cells have a threshold voltage greater than or equal to Vv14. When programming memory cells to data state S15, the system will test whether those memory cells have a threshold voltage greater than or equal to Vv15.

In one embodiment, known as full sequence programming, memory cells can be programmed from the erased data state S0 directly to any of the programmed data states S1-S15. For example, a population of memory cells to be programmed may first be erased so that all memory cells in the population are in erased data state S0. Then, a programming process is used to program memory cells directly into data states S1, S2, S3, S4, S5, S6, S7, S8, S9, S10, S11, S12, S13, S14 and/or S15. For example, while some memory cells are being programmed from data state S0 to data state S1, other memory cells are being programmed from data state S0 to data state S2 and/or from data state S0 to data state S3, and so on. The arrows of FIG. 8A represent the full sequence programming.

Figure 8B:
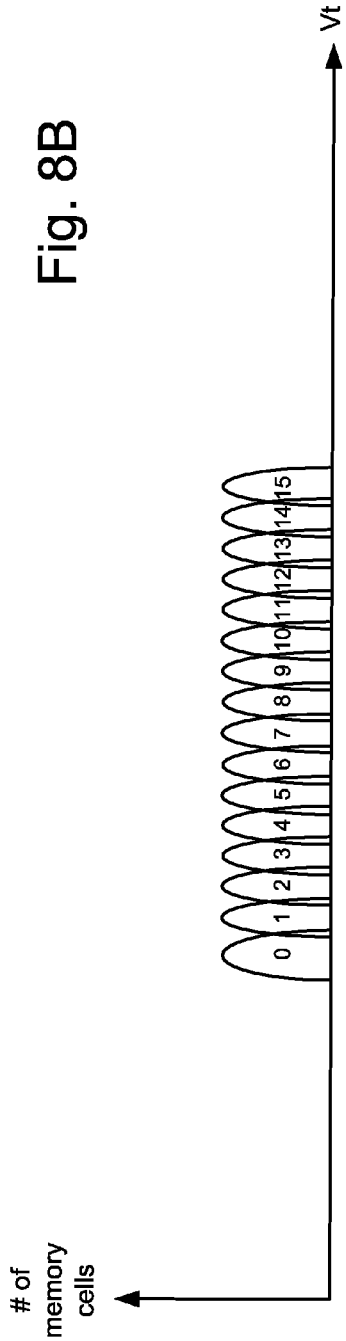

FIG. 8B illustrates that another embodiment of threshold voltage distributions corresponding to data states S0-S15 that can partially overlap since the error correction can handle a certain percentage of memory cells that are in error. Because of the size of the drawing, the references to the data states have been truncated such that 0 is used rather than S0, 1 is used rather than S1, 2 is used rather than S2, and so on.

FIGS. 9A-D describe a three stage programming process for programming data into memory cells that store four bits of data. Prior to programming, all of the memory cells for a block will be erased into an erased threshold voltage distribution. For example, FIG. 9A shows a block of memory cells starting in an erased threshold voltage distribution E (depicted with a dotted line). In some embodiments, erased threshold voltage E is below zero volts. In other embodiments, erased threshold voltage distribution E is above zero volts, or partially above zero volts.

In this embodiment, the programming process includes three stages. During the first stage of programming, those memory cells whose targets (due to the data to be stored in those memory cells) are data states S4, S5, S6 or S7 are programmed to an intermediate state IM0. Those memory cells whose targets are data states S8, S9, S10 or S11 are programmed to an intermediate state IM1. Those memory cells whose targets are data states S12, S13, S14 or S15 are programmed to an intermediate state IM2. Those memory cells are targeted for data states S0, S1, S2 or S3 and remain in the erased threshold voltage distribution E. The first phase is graphically depicted by FIG. 9A.

During the second stage of the programming process of FIGS. 9A-C, those memory cells that are in the erased threshold voltage distribution E are programmed to their target data states. For example, those memory cells to be programmed to data state S3 are programmed from erased threshold voltage distribution E to data state S3, those memory cells to be programmed to data state S2 are programmed from erased threshold voltage distribution E to data state S2, those memory cells to be programmed to data state S1 are programmed from erase threshold voltage distribution E to data state S1, and those memory cells to be in data state S0 are not programmed during the second phase of the programming process. Thus, erased threshold voltage distribution E becomes data state S0. Also, during the second phase, memory cells are programmed from the intermediate state IM0 to various data states S4-S7. For example, those memory cells to be programmed to data state S7 are programmed from the intermediate state IM to data state S7, those memory cells targeted to be in data state S6 are programmed from intermediate state IM to data state S6, both memory cells to be programmed to data state S5 are programmed from intermediate state IM to data state S5, and those memory cells to be programmed to data state S4 are programmed from intermediate state IM to data state S4. Memory cells are also programmed from the intermediate state IM1 to various data states S8-S11. For example, those memory cells to be programmed to data state S11 are programmed from the intermediate state IM1 to data state S11, those memory cells targeted to be in data state S10 are programmed from intermediate state IM1 to data state S10, those memory cells to be programmed to data state S9 are programmed from intermediate state IM1 to data state S9, and those memory cells to be programmed to data state S8 are programmed from intermediate state IM1 to data state S8. Memory cells are also programmed from the intermediate state IM2 to various data states S12-S15. For example, those memory cells to be programmed to data state S15 are programmed from the intermediate state IM2 to data state S15, those memory cells targeted to be in data state S14 are programmed from intermediate state IM2 to data state S14, those memory cells to be programmed to data state S13 are programmed from intermediate state IM2 to data state S13, and those memory cells to be programmed to data state S12 are programmed from intermediate state IM2 to data state S12. This second phase of programming is illustrated in FIG. 9B.

As can be seen in FIG. 9B, at the end of the second phase of programming data states S1-S15 overlap with neighboring data states. For example, data state S1 overlaps with data state S2, data state S2 overlaps with data states S1 and S3, data state S3 overlaps with data states S2 and S4, data state S4 overlaps with data states S3 and S5, data state S5 overlaps with data states S4 and S6, and data state S6 overlaps with data states S5 and S7, and so on. In some embodiments, all or some of the data states do not overlap.

In the third stage of programming, each of data states S1-S15 are tightened so that they no longer overlap with neighboring states. This is depicted graphically by FIG. 9C. In some embodiments, data state S0 is wider than data states S1-S15.

One programming strategy for achieving tighter threshold is to use a coarse/fine programming process. The coarse programming phase includes attempts to raise the threshold voltage in a faster manner, paying relatively less attention to achieving a tight threshold distribution. The fine programming phase attempts to raise the threshold voltage in a slower manner in order to reach the target threshold voltage while also achieving a tighter threshold distribution. Coarse/fine programming is only one example of a multi-phased programming process that can be used with the technology described herein. Other multi-phased programming process that divide the programming into different phases that test for programming to intermediate levels prior to a final target level can also be used.

FIGS. 10A, 10B, 11A and 11B provide more details of one example of a coarse/fine programming methodology. FIGS. 10A and 11A depict the threshold voltage of the memory cells being programmed FIGS. 10B and 11B depict the bit line voltages for the memory cells being programmed. This example of FIGS. 10A, 10B, 11A and 11B uses two verify levels, indicated in the Figures as threshold voltage references VH and VL. The final target level is VH (also referred to as a fine verify level, threshold voltage reference for the fine phase or a high verify level for a data state). When a threshold voltage of the memory cell has reached VH, the memory cell will be inhibited from further programming by applying an inhibit voltage to the bit line corresponding to that memory cell so that the memory cell does not experience any additional programming. For example, the bit line voltage (or control gate or word line voltage—in some embodiments) can be raised to Vinhibit (e.g., Vdd) or similar voltage. However, when a memory cell satisfies a threshold voltage close to (but lower than) the threshold voltage references VH, the threshold voltage shift for the memory cell during subsequent programming is slowed down (not inhibited) by applying an intermediate voltage to the bit line, typically in the order of 0.3 v to 0.8 v. Because the rate of threshold voltage shift is reduced during the next few doses of programming, the final threshold voltage distribution can be narrower than with other programming methods. To implement this method, a second verify level that is lower than that of VH is used. This second verify level is depicted in FIG. 10A and FIG. 11A as VL (also referred to as a coarse verify level, threshold voltage reference for the coarse phase or a low or intermediate verify level for a data state), with VH>VL. When the threshold voltage of the memory cell is larger than VL, but still lower than VH, the threshold voltage shift to the memory cell will be reduced (not inhibited) for subsequent programming by applying a bit line bias Vfine (see FIG. 11B), which as explained above can be typically in the order of 0.3 v to 0.8 v. Note that in this case, two verify operations are required for each data state: one verify operation at the corresponding VH for each data state, and one verify operation at the corresponding VL for each data state.

FIGS. 10A and 10B show the behavior of a memory cell whose threshold voltage moves past VH and VL in between t2 and t3. Thus, prior to t3, the memory cell is in the coarse phase. After t3, the memory cell is in the inhibit mode. This example memory cell does not go into the fine mode.

FIGS. 11A and 11B depict a memory cell that enters both the coarse and fine programming phases. The threshold voltage of the memory cell crosses VL in between time t2 and time t3. Prior to t3, the memory cell is in the coarse phase. After t3, the bit line voltage is raised to Vs; therefore, the memory cell is in the fine phase. In between t3 and t4, the threshold voltage of the memory cell crosses VH; therefore, the memory cell is inhibited from further programming by raising the bit line voltage to Vinhibit at t4 and the memory cell does not experience additional programming for the current programming process. If the coarse/fine programming scheme was not being used, the threshold voltage of the memory cells could exceed VH by a margin much more than depicted in FIG. 11A.

As explained above, the coarse/fine programming of FIGS. 10A/B and 11A/B uses two verify operations for each data state. One verify operation is performed at the corresponding VH for each data state, and one verify operation at the corresponding VL for each data state. Looking back at FIG. 8A, when not using coarse/fine programming only 15 verify levels are needed. With coarse/fine programming, 30 verify levels are used as each target from FIG. 8A (e.g., Vv1, Vv2, Vv3, Vv4, . . . ) is being replaced by two reference levels (e.g., S1VL, S1VH, S2VL, S2VH, S3VL, S3VH, S4VL, S4VH, . . . ).

When programming an EEPROM or flash memory device, such as a NAND flash memory device, typically a program voltage is applied to the word line or control gate and the bit line is grounded. Electrons from the channel are then injected into the charge trapping material. When electrons accumulate in the charge trapping material, the charge trapping material becomes negatively charged and the threshold voltage of the memory cell is raised so that the memory cell is in a programmed state. In many cases, the program voltage is applied to the word line/control gate as a series of voltage pulses (referred to as programming pulses), with the magnitude of the pulses increasing at each pulse (or for a subset of pulses). Between programming pulses, a set of one or more verify operations are performed to determine whether the memory cell(s) being programmed have reached their target level. When using the above-described coarse/fine programming with sixteen data states, one implementation may need to perform thirty verify operations between each of the programming pulses. In some embodiments, a subset of verify operations can be skipped in circumstances when the system knows that no memory cells being programmed has a threshold voltage in the range of certain data states. However, up to thirty verify operations are performed as each memory cell would be subjected to both a coarse verify operation and a fine verify operation. Performing thirty verify operations can slow down the programming process.

FIG. 12A is a graph that explains a theory for one embodiment of a programming process that reduces the time needed to verify programming for multi-state non-volatile memory implementing coarse/fine programming. The proposed process reduces the number of verify operations by splitting up the coarse verify operation from the fine verify operation so that a memory cell would first only be subjected to a coarse verify operation, and not a fine verify operation. Subsequently, a memory cell would only be subjected to a fine verify operation and not a coarse verify operation. Each curve 620, 622, 624, 626, 628 and 630 of FIG. 12A shows the threshold voltage of a memory cell changing in response to a programming pulse. Curves 620-628 represent operation in the coarse phase. Curve 630 represents operation in the fine phase. After each of the programming pulses causing the change in threshold voltage represented by curves 620-626, the memory cell is only verified for VL. Curve 628 shows the threshold voltage surpassing VL; therefore, the memory cell will enter the fine phase and subsequently only be verified for VH (e.g., after the programming pulses causing the change in threshold voltage represented by curve 630). Thus, the memory cell only experiences one verify operation between programming pulses. Since only one verify operation is needed (ie VL only or VH only), rather than two (VL and then VH), the system need only perform up to fifteen verify operations for multi-state non-volatile memory implementing coarse/fine programming over sixteen data states (ie S0-S15), which increase the speed of the programming process.

Figure 12B:
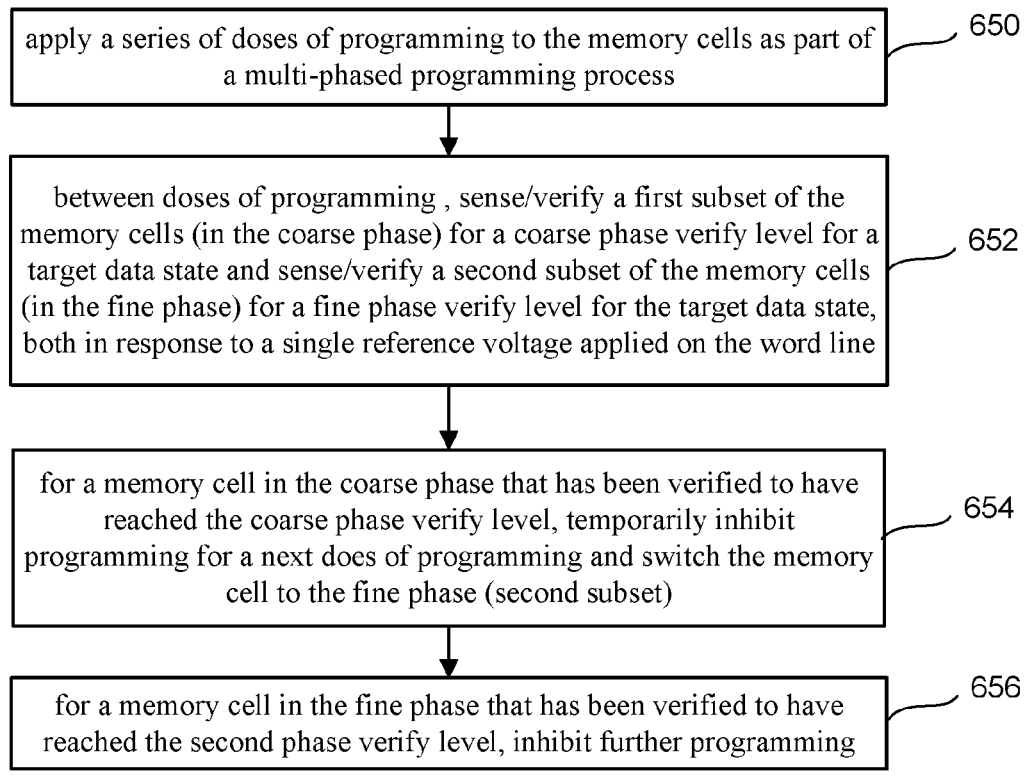
FIG. 12B is a flow chart describing one embodiment of a process for programming using a multi-phased programming methodology, such as coarse/fine programming.

To achieve the splitting up of the coarse verify operation from the fine verify operation for a given memory cell, one embodiment of the proposed memory system implements the process of FIG. 12B which includes performing the coarse verify operation for some memory cells concurrently with performing the fine verify operation for other memory cells. In step 650, the system applies a series of doses of programming (e.g., programming pulses) to the memory cells as part of a multi-phased programming process. One embodiment of a multi-phased programming process is coarse/fine programming Other multi-phased programming processes can also be used. One example of another suitable multi-phased programming processes is a three phased process that includes a coarse phase, an intermediate phase and a fine phase. The technology described herein is not limited to any particular multi-phased programming processes. In some embodiments where the series of doses of programming is a series of programming pulses (ie voltage pulses), the programming pulses increase in magnitude with each new pulse by a constant or changing step size. In other embodiments, the magnitude of the programming pulses can remain constant. In some embodiments, the duration of the programming pulses can change.

Between the doses of programming, the system senses (e.g., verifies) a first subset of the memory cells (e.g., in the coarse phase) for a coarse phase verify level for a target data state and senses (e.g., verifies) a second subset of the memory cells (e.g., in the fine phase) for a fine phase verify level for the target data state, both in response to a single reference voltage applied on the word line (step 652). In one embodiment, the verification of the memory cells in the coarse phase is performed concurrently with the verification of the memory cells in the fine phase.

For a memory cell in the coarse phase (or first phase of a different multi-phased programming processes) that has been verified to have reached the coarse phase verify level, the system temporarily inhibits programming for one or more subsequent doses of programming (e.g., the next programming pulse) and switches/adds the memory cell to the fine phase (or second phase) in step 654. During programming in the fine phase, the bit line will receive Vfine in order to slow down programming (e.g., reduce how much the threshold voltage for a cell changes as a result of the programming pulse). In other embodiments, other means can be used to slow down programming, such as changing the channel voltage, changing the source line voltage, boosting the channel, etc. A memory cell that is switched to the fine phase is now part of the second subset of memory cells that are verified for the fine phase (see step 652). Note that in some embodiments, the system does not temporarily inhibit programming for a next programming pulse. In some embodiments, the memory cell is temporarily inhibited for a subsequent programming pulse that is not the next programming pulse (i.e. such as the next programming pulse+1).

For a memory cell in the fine phase that has been verified to have reached the second phase verify level, the system inhibits further programming. For example, the bit line voltage can be raised to Vinhibit (e.g., Vdd) for future programming pulses.

As used herein, inhibiting programming of a memory cell refers to stopping programming or counteracting the programming effect of a programming signal/source, or reducing the programming effect to such an extent that it has become negligible. Inhibiting programming of a memory cell may include different technical operations that depend on the non-volatile memory technology of the memory cell. For example, in the charge trapping memory cell discussed above, a dose of programming (e.g. programming iteration) includes applying a voltage pulse, and inhibiting programming of the memory cell may include increasing the voltage on a connected bit line such that the programming pulse has little, to no, effect on the threshold voltage of the memory cell. Similarly, for a two-dimensional floating gate flash memory cell, a dose of programming includes applying a voltage pulse and inhibiting programming of the memory cell may include increasing the voltage on a connected bit line.

The technology of FIG. 12B can also be utilized with technologies in addition to the charge trapping and floating gate flash memory described above. In addition to flash memory (e.g., 2D and 3D NAND-type and NOR-type flash memory), examples of non-volatile memory include ReRAM memories, magnetoresistive memory (e.g., MRAM), and phase change memory (e.g., PCRAM).

One example of a ReRAM memory includes reversible resistance-switching elements arranged in cross pint arrays accessed by X lines and Y lines (e.g., word lines and bit lines). Programming can be supplied by a series of voltage pulses (ie doses of programming) on the word lines. Memory cells can be inhibited by applying a large enough voltage on the corresponding bit lines to prevent a sufficient voltage differential across the memory cell.

In another embodiment, the memory cells may include conductive bridge memory elements. A conductive bridge memory element may also be referred to as a programmable metallization cell. A conductive bridge memory element may be used as a state change element based on the physical relocation of ions within a solid electrolyte. In some cases, a conductive bridge memory element may include two solid metal electrodes, one relatively inert (e.g., tungsten) and the other electrochemically active (e.g., silver or copper), with a thin film of the solid electrolyte between the two electrodes. As temperature increases, the mobility of the ions also increases causing the programming threshold for the conductive bridge memory cell to decrease. Thus, the conductive bridge memory element may have a wide range of programming thresholds over temperature. Applying appropriate temperatures (over discrete periods of time—doses) can be used to program. Similarly, adjusting temperature can be used to inhibit. In some implementations, temperatures are controlled by applying voltages and/or currents to the memory cells and/or surrounding components.

Magnetoresistive memory (MRAM) stores data by magnetic storage elements. The elements are formed from two ferromagnetic plates, each of which can hold a magnetization, separated by a thin insulating layer. One of the two plates is a permanent magnet set to a particular polarity; the other plate's magnetization can be changed to match that of an external field to store memory. This configuration is known as a spin valve and is the simplest structure for an MRAM bit. A memory device is built from a grid of such memory cells. In one embodiment for programming, each memory cell lies between a pair of write lines arranged at right angles to each other, parallel to the cell, one above and one below the cell. When current is passed through them, an induced magnetic field is created (ie the dose of programming) This approach requires a fairly substantial current to generate the field. Therefore, the programming is applied as a unit of current. Sufficiently reducing or removing the current can be used to inhibit programming.

Phase change memory (PCRAM) exploits the unique behavior of chalcogenide glass. One embodiment uses a GeTe—Sb2Te3 super lattice to achieve non-thermal phase changes by simply changing the co-ordination state of the Germanium atoms with a laser pulse (or light pulse from another source). Therefore, the doses of programming are laser pulses. The memory cells can be inhibited by blocking the memory cells from receiving the light. Note that the use of "pulse" in this document does not require a square pulse, but includes a (continuous or non-continuous) vibration or burst of sound, current, voltage light, or other wave.

The process of FIG. 12B can be performed at the direction of state machine 112 and/or controller 122. In one embodiment, state machine 112 (or controller 122) will direct decoders 114/124/132, power control module 116, sense blocks SB1, SB2, . . . , SBp, and read/write circuits 128 to perform the functions described in FIG. 12B. For example, sense blocks SB1, SB2, . . . , SBp (each including one or more circuits of FIG. 5) can detect that a first subset of the memory cells having a threshold voltage that satisfies a first voltage level (e.g., coarse phase verify level) and a second subset of the memory cells having a threshold voltage that satisfies a second voltage level (e.g., coarse phase verify level) between programming pulses. State machine 112 (or controller 122) in combination with decoders 114/124/132 and power control module 116 operate as a lockout circuit, including a low threshold voltage lockout circuit configured to stop programming of the first subset of memory cells during at least one subsequent programming pulse in the series or programming pulses and a high threshold voltage lockout circuit configured to stop programming of the second subset of memory cells during subsequent programming pulses in the series. Note that, in one embodiment, memory cells in the first subset are distinct from memory cells in the second subset.

Figure 13:
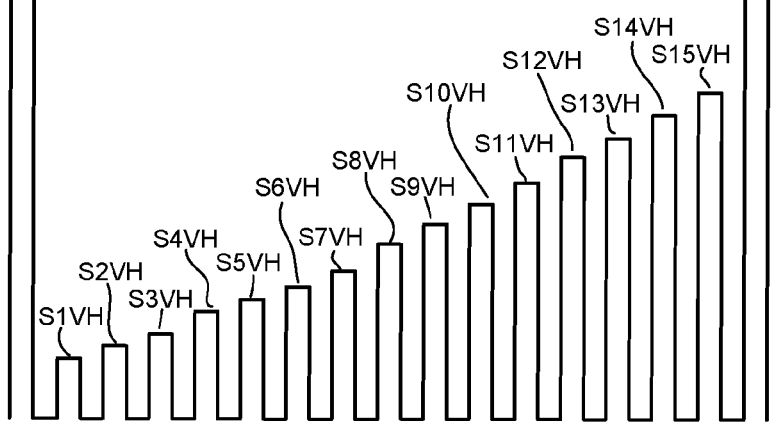
FIG. 13 depicts a waveform applied to a word line during a process for programming.

As described above, one embodiment of step 650 of FIG. 12B includes applying a series of programming pulses and step 652 includes performing multiple pairs of verify operations. In one embodiment, each pair of verify operations is for a single data state and will include applying the appropriate verify reference voltage (e.g., Vv1, Vv2, Vv3, Vv4, Vv5, Vv6, Vv7, Vv8, Vv9, Vv10, Vv11, Vv12, Vv13, Vv14, Vv15) to the common word line for the memory cells being programmed FIG. 13 depicts apportion of a voltage waveform applied to the common word line. Typically, a programming process may use 10-20 programming pulses. FIG. 13 depicts two of the programming pulses (labeled Vpgm pulse) and the fifteen verify voltage pulses (S1VH, S2VH, S3VH, S4VH, S5VH, S6VH, S7VH, S8VH, S9VH, S10VH, S11VH, S12VH, S13VH, S14VH, S15VH) used for the verify operations. In one embodiment, S1VH=Vv1, S2VH=Vv2, S#VH=Vv3, etc. Step 652 of FIG. 12B includes performing a verify operation a first subset of the memory cells in the coarse phase for a coarse phase verify level for a target data state while verifying a second subset of the memory cells in the fine phase for a fine phase verify level for the target data state, both in response to a single reference voltage applied on the common word line, That single reference voltage applied to the common word line is the respective verify voltage pulse.

Figure 14:
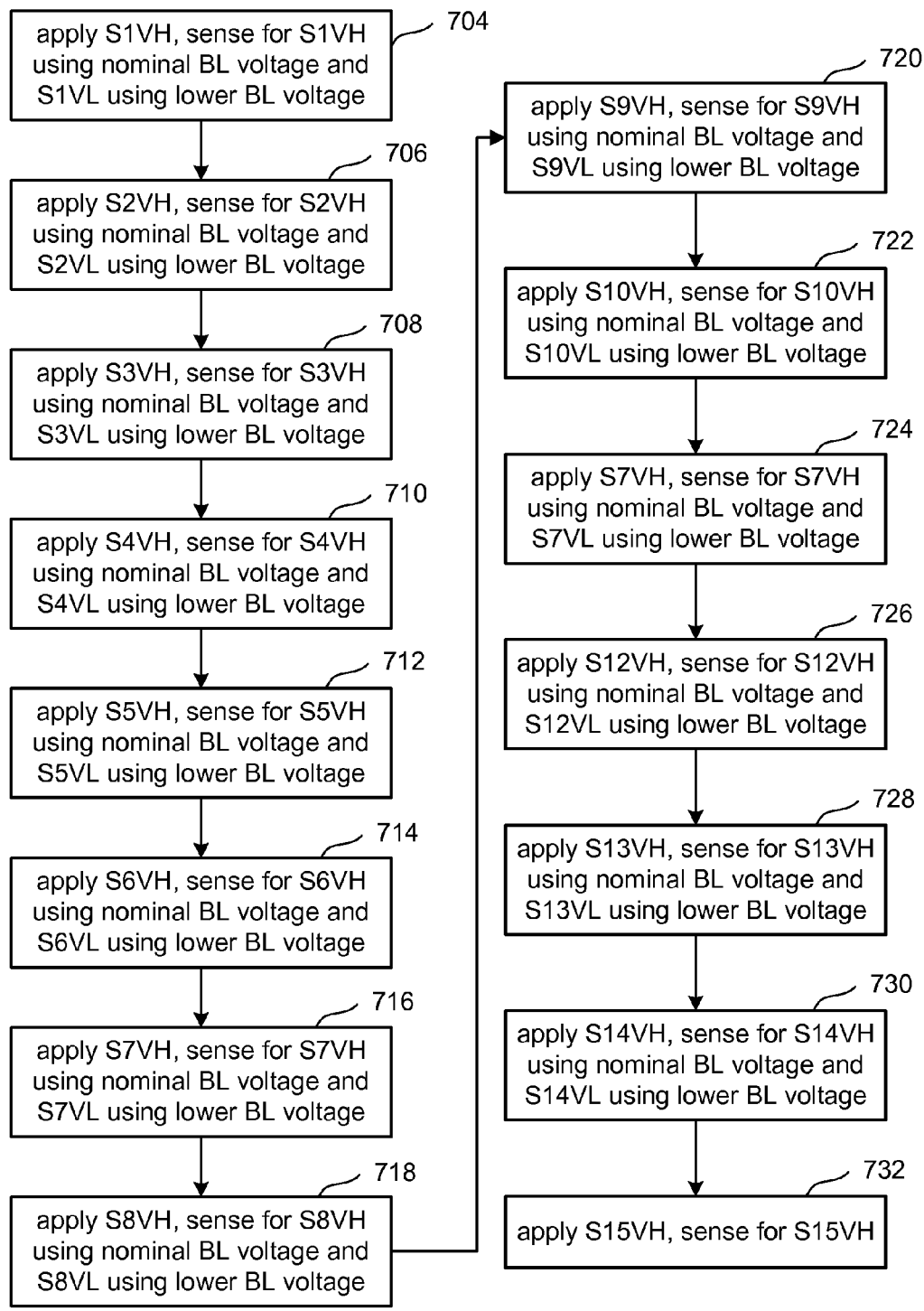
FIG. 14 is a flow chart describing one embodiment of a process for verifying programming.

FIG. 14 is a flow chart describing one embodiment of a process of performing verification using the technology proposed herein, including the waveform of FIG. 13. The process of FIG. 14 is an example implementation of step 652 of FIG. 12B using the circuits of FIGS. 1-5. In one embodiment, the process of FIG. 14 is performed between each set of successive programming pulses.

One feature of the process of FIG. 14 is that is provides for concurrently verifying for coarse and fine phases by varying the respective bit line voltages. In general, changing the bit line voltage of a memory cell for a verify operation effectively moves a memory cell's Id-Vg curve based on Drain Induced Barrier Lowering (DIBL). Changing the voltage that a bit line is charged to for a verify operation causes a shift in the apparent (ie measured) threshold voltage of a memory cell connected to the bit line. For example, lowering the bit line voltage is like shortening the strobe time, which makes the apparent threshold voltage of the memory cell seem higher. Conversely, increasing the bit line voltage is like increasing the strobe time, which makes the apparent threshold voltage of the memory cell seem lower. Therefore, using a lower bit line voltage during sensing is effectively sensing the memory cell for a lower threshold voltage than the control gate (word line) voltage being applied. The process of FIG. 14 uses this theory to adjust the bit line voltages so that for a set of memory cells being connected to a common bit line, some of the memory cells will be verified for VL of data state N and other memory cells will be concurrently verified for VH of data state N. In one set of embodiments, the word line voltage applied is for VH of state N.

In step 704, the voltage S1VH is applied to the selected word. In one embodiment, all of the memory cells being programmed and verified are connected to the selected word line. While S1VH is applied to the selected word line (and, therefore, applied to the control gates of the memory cells being verified), the sense amplifier (discussed above) is used to sense whether the threshold voltages of a first subset of the memory cells connected to the selected word line are above or below S1VL and concurrently whether the threshold voltages of a second subset of the memory cells connected to the selected word line are above or below S1VH. This is done concurrently because in this embodiment the bit lines for memory cells being verified for S1VL receive a lower voltage for the verify operation than the bit lines for memory cells being verified for S1VH. The first subset of the memory cells connected to the selected word line are those memory cells being programmed to data state S1 and verified for S1VL because they are in the coarse phase. The second subset of the memory cells are those memory cells being programmed to data state S1 and verified for S1VH because they are in the fine phase. The state machine and the individual sense blocks (SB1, SB2, . . . ) know what data state the memory cells are being programmed to because they store the programming data as part of the programming process. Thus, the bit lines connected to the second subset of the memory cells receives the nominal bit line voltage (also referred to below as VBLC_VH), while the bit lines connected to the first subset of the memory cells receive the lower bit line voltage (also referred to below as VBLC_VL). In one example, the lower bit line voltage VBLC_VL for the first subset of the memory cells is ~200 mV lower than the nominal bit line voltage VBLC_VH for the first subset of the memory cells; however, other voltage differences. can also be used. In one embodiment, the nominal bit line voltage VBLC_VH is 700 mv and the lower bit line voltage VBLC_VL is 500 mv. In another embodiment, the nominal bit line voltage VBLC_VH is 250 mv and the lower bit line voltage VBLC_VL is 200 mv. Other values can also be used, depending on the particular circuit implementation.

In step 706, the voltage S2VH is applied to the selected word to enable verification of the memory cells being programmed to data state S2. While S2VH is applied to the selected word line, the sense amplifier concurrently senses whether the threshold voltages of a first subset of the memory cells connected to the selected word line that are in the coarse phase are above or below S2VL and whether the threshold voltages of a second subset of the memory cells connected to the selected word line that are in the fine phase are above or below S2VH. To enable this function, the bit lines connected to the second subset of the memory cells receive the nominal bit line voltage VBLC_VH, while the bit lines connected to the first subset of the memory cells receive the lower bit line voltage VBLC_VL.

In step 708, the voltage S3VH is applied to the selected word to enable verification of the memory cells being programmed to data state S3. While S3VH is applied to the selected word line, the sense amplifier concurrently senses whether the threshold voltages of a first subset of the memory cells connected to the selected word line that are in the coarse phase are above or below S3VL and whether the threshold voltages of a second subset of the memory cells connected to the selected word line that are in the fine phase are above or below S3VH. To enable this function, the bit lines connected to the second subset of the memory cells receive the nominal bit line voltage VBLC_VH, while the bit lines connected to the first subset of the memory cells receive the lower bit line voltage VBLC_VL.

In step 710, the voltage S4VH is applied to the selected word to enable verification of the memory cells being programmed to data state S4. While S4VH is applied to the selected word line, the sense amplifier concurrently senses whether the threshold voltages of a first subset of the memory cells connected to the selected word line that are in the coarse phase are above or below S4VL and whether the threshold voltages of a second subset of the memory cells connected to the selected word line that are in the fine phase are above or below S4VH. To enable this function, the bit lines connected to the second subset of the memory cells receive the nominal bit line voltage VBLC_VH, while the bit lines connected to the first subset of the memory cells receive the lower bit line voltage VBLC_VL.

In step 712, the voltage S5VH is applied to the selected word to enable verification of the memory cells being programmed to data state S5. While S5VH is applied to the selected word line, the sense amplifier concurrently senses whether the threshold voltages of a first subset of the memory cells connected to the selected word line that are in the coarse phase are above or below S5VL and whether the threshold voltages of a second subset of the memory cells connected to the selected word line that are in the fine phase are above or below S5VH. To enable this function, the bit lines connected to the second subset of the memory cells receive the nominal bit line voltage VBLC_VH, while the bit lines connected to the first subset of the memory cells receive the lower bit line voltage VBLC_VL.

In step 714, the voltage S6VH is applied to the selected word to enable verification of the memory cells being programmed to data state S6. While S6VH is applied to the selected word line, the sense amplifier concurrently senses whether the threshold voltages of a first subset of the memory cells connected to the selected word line that are in the coarse phase are above or below S6VL and whether the threshold voltages of a second subset of the memory cells connected to the selected word line that are in the fine phase are above or below S6VH. To enable this function, the bit lines connected to the second subset of the memory cells receive the nominal bit line voltage VBLC_VH, while the bit lines connected to the first subset of the memory cells receive the lower bit line voltage VBLC_VL.

In step 716, the voltage S7VH is applied to the selected word to enable verification of the memory cells being programmed to data state S7. While S7VH is applied to the selected word line, the sense amplifier concurrently senses whether the threshold voltages of a first subset of the memory cells connected to the selected word line that are in the coarse phase are above or below S7VL and whether the threshold voltages of a second subset of the memory cells connected to the selected word line that are in the fine phase are above or below S7VH. To enable this function, the bit lines connected to the second subset of the memory cells receive the nominal bit line voltage VBLC_VH, while the bit lines connected to the first subset of the memory cells receive the lower bit line voltage VBLC_VL.

In step 718, the voltage S8VH is applied to the selected word to enable verification of the memory cells being programmed to data state S8. While S8VH is applied to the selected word line, the sense amplifier concurrently senses whether the threshold voltages of a first subset of the memory cells connected to the selected word line that are in the coarse phase are above or below S8VL and whether the threshold voltages of a second subset of the memory cells connected to the selected word line that are in the fine phase are above or below S8VH. To enable this function, the bit lines connected to the second subset of the memory cells receive the nominal bit line voltage VBLC_VH, while the bit lines connected to the first subset of the memory cells receive the lower bit line voltage VBLC_VL.

In step 720, the voltage S9VH is applied to the selected word to enable verification of the memory cells being programmed to data state S9. While S9VH is applied to the selected word line, the sense amplifier concurrently senses whether the threshold voltages of a first subset of the memory cells connected to the selected word line that are in the coarse phase are above or below S9VL and whether the threshold voltages of a second subset of the memory cells connected to the selected word line that are in the fine phase are above or below S9VH. To enable this function, the bit lines connected to the second subset of the memory cells receive the nominal bit line voltage VBLC_VH, while the bit lines connected to the first subset of the memory cells receive the lower bit line voltage VBLC_VL.

In step 722, the voltage S10VH is applied to the selected word to enable verification of the memory cells being programmed to data state S10. While S10VH is applied to the selected word line, the sense amplifier concurrently senses whether the threshold voltages of a first subset of the memory cells connected to the selected word line that are in the coarse phase are above or below S10VL and whether the threshold voltages of a second subset of the memory cells connected to the selected word line that are in the fine phase are above or below S10VH. To enable this function, the bit lines connected to the second subset of the memory cells receive the nominal bit line voltage VBLC_VH, while the bit lines connected to the first subset of the memory cells receive the lower bit line voltage VBLC_VL.

In step 724, the voltage S11VH is applied to the selected word to enable verification of the memory cells being programmed to data state S11. While S11VH is applied to the selected word line, the sense amplifier concurrently senses whether the threshold voltages of a first subset of the memory cells connected to the selected word line that are in the coarse phase are above or below S11VL and whether the threshold voltages of a second subset of the memory cells connected to the selected word line that are in the fine phase are above or below S11VH. To enable this function, the bit lines connected to the second subset of the memory cells receive the nominal bit line voltage VBLC_VH, while the bit lines connected to the first subset of the memory cells receive the lower bit line voltage VBLC_VL.

In step 726, the voltage S12VH is applied to the selected word to enable verification of the memory cells being programmed to data state S12. While S12VH is applied to the selected word line, the sense amplifier concurrently senses whether the threshold voltages of a first subset of the memory cells connected to the selected word line that are in the coarse phase are above or below S12VL and whether the threshold voltages of a second subset of the memory cells connected to the selected word line that are in the fine phase are above or below S12VH. To enable this function, the bit lines connected to the second subset of the memory cells receive the nominal bit line voltage VBLC_VH, while the bit lines connected to the first subset of the memory cells receive the lower bit line voltage VBLC_VL.

In step 728, the voltage S13VH is applied to the selected word to enable verification of the memory cells being programmed to data state S13. While S13VH is applied to the selected word line, the sense amplifier concurrently senses whether the threshold voltages of a first subset of the memory cells connected to the selected word line that are in the coarse phase are above or below S13VL and whether the threshold voltages of a second subset of the memory cells connected to the selected word line that are in the fine phase are above or below S13VH. To enable this function, the bit lines connected to the second subset of the memory cells receive the nominal bit line voltage VBLC_VH, while the bit lines connected to the first subset of the memory cells receive the lower bit line voltage VBLC_VL.

In step 730, the voltage S14VH is applied to the selected word to enable verification of the memory cells being programmed to data state S14. While S14VH is applied to the selected word line, the sense amplifier concurrently senses whether the threshold voltages of a first subset of the memory cells connected to the selected word line that are in the coarse phase are above or below S14VL and whether the threshold voltages of a second subset of the memory cells connected to the selected word line that are in the fine phase are above or below S14VH. To enable this function, the bit lines connected to the second subset of the memory cells receive the nominal bit line voltage VBLC_VH, while the bit lines connected to the first subset of the memory cells receive the lower bit line voltage VBLC_VL.

In step 732, the voltage S15VH is applied to the selected word. While S15VH is applied to the selected word line (and, therefore, applied to the control gates of the memory cells being verified), the sense amplifier (discussed above) is used to sense whether the threshold voltages of the memory cells connected to the selected word line and being programmed to data state S15 are above or below S15VH. In one embodiment, memory cells being programmed to data state S15 are not subjected to coarse/fine programming.

As described above, in each of steps 704-730, the system is configured to apply a reference voltage to the memory cells and sense whether different memory cells have reached different verify levels for a data state in response to the reference voltage by applying different bit line voltages to different bit lines connected to the different memory cells.

The process of FIG. 14 can be performed at the direction of state machine 112 and/or controller 122. For example, in one embodiment, state machine 112 (or controller 122) will direct decoders 114/124/132, power control module 116, sense blocks SB1, SB2, . . . , SBp, and read/write circuits 128 to perform the functions described in FIG. 14.

Figure 15:
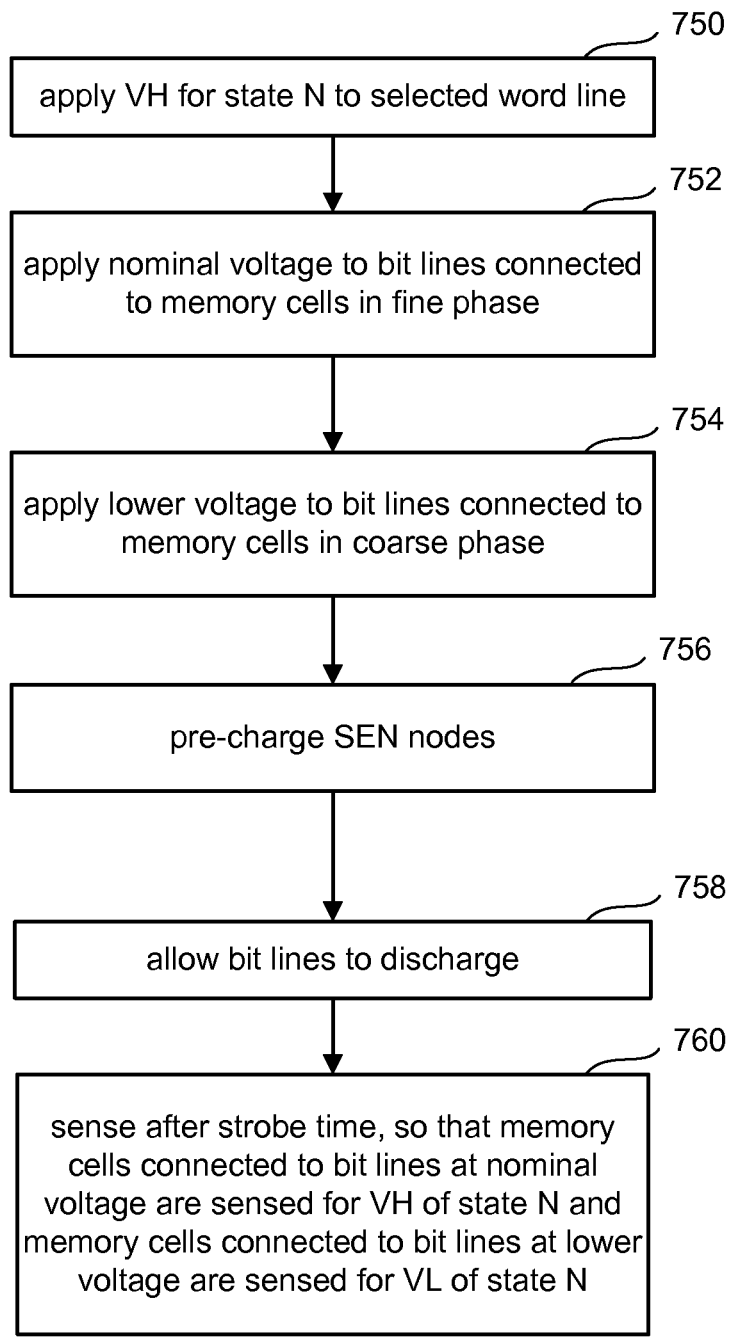
FIG. 15 is a flow chart describing one embodiment of a process for sensing.

FIG. 15 is a flow chart describing a single strobe sensing operation performed during each of steps 704-730. The process of FIG. 15 provides further details of one or more control circuits sensing whether different memory cells have reached different verify levels for a data state in response to the reference voltage by applying different bit line voltages to different bit lines connected to the different memory cells. In particular, the process of FIG. 15 relates to the operation of the circuit of FIG. 5. In step 750, the appropriate data state N verify reference voltage VH (e.g., S1VH, S2VH, S3VH, S4VH, S5VH, S6VH, S7VH, S8VH, S9VH, S10VH, S11VH, S12VH, S13VH, and S14VH) is applied to the selected word line (also refereed to elsewhere in this document as the common word line). The selected word line is connected to the memory cells being programmed and verified. In step 752, the nominal bit line voltage (e.g., 0.7 volts) is applied to the bit lines connected to memory cells in the fine phase (e.g., verified to VH for data state N). In step 754, a voltage that is lower than the nominal bit line voltage is applied to bit lines connected to memory cells in the coarse phase (e.g., verified to VL for data state N). In step 756, all of the SEN nodes of the sense amplifiers connected to the memory cells being verified are simultaneously pre-charged, as discussed above. In step 758, the SEN nodes and capacitors 516 of the sense amplifiers are allowed to discharge, for example, by discharging through the memory cells, as discussed above. In step 760, after a predetermined time period, referred to as the "strobe time," the voltage of the capacitor 516 (or the SEN node) is sampled as described above to determine whether the respective memory cell(s) conducted so that memory cells connected to bit lines at nominal voltage are sensed for VH of state N and memory cells connected to bit lines at lower voltage are sensed for VL of state N. As described above, the verification process is performed simultaneously for thousands of memory cells connected to the same word line and different bit lines.

Figure 16:
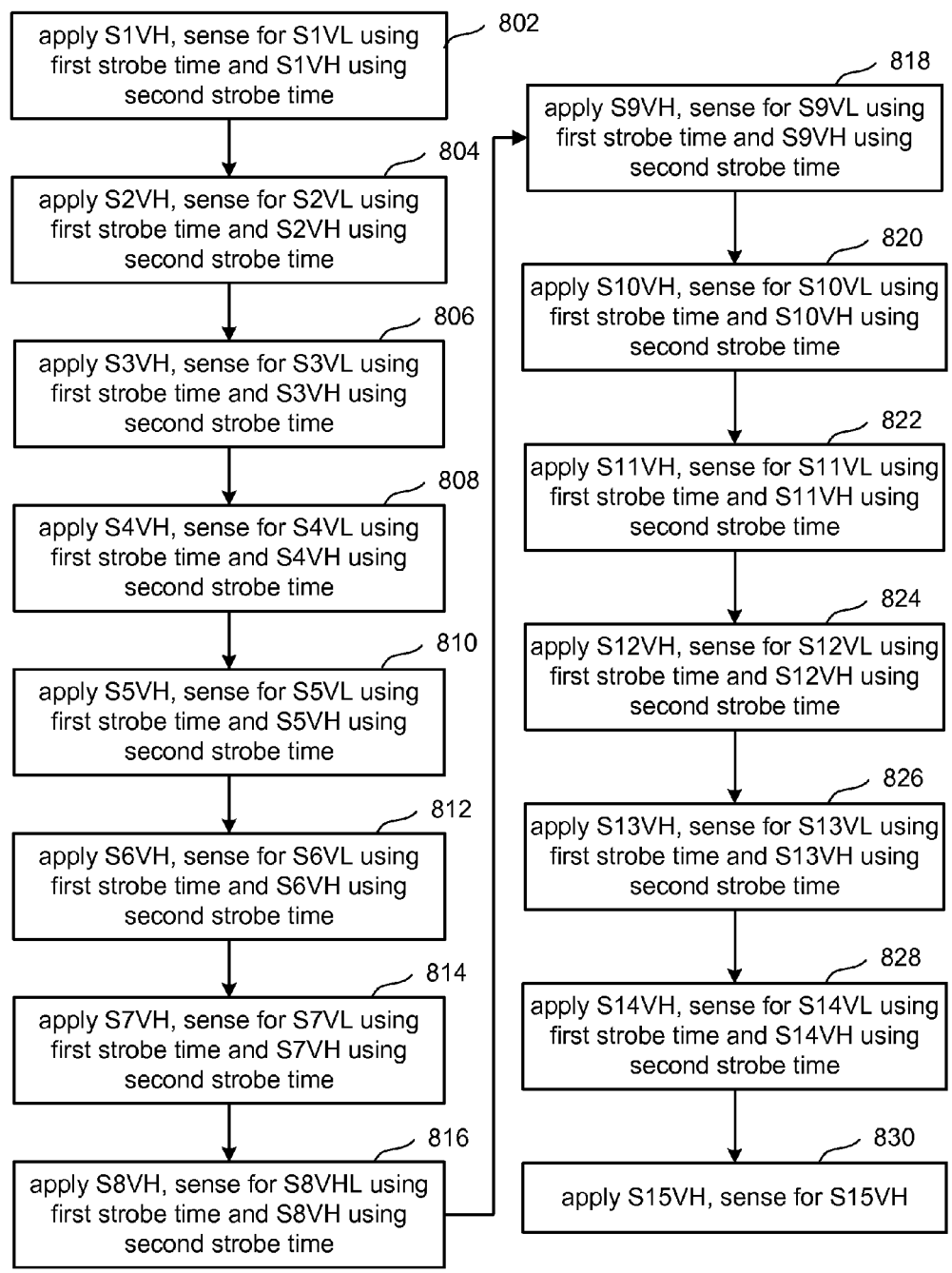
FIG. 16 is a flow chart describing one embodiment of a process for verifying programming.
Figure 17:
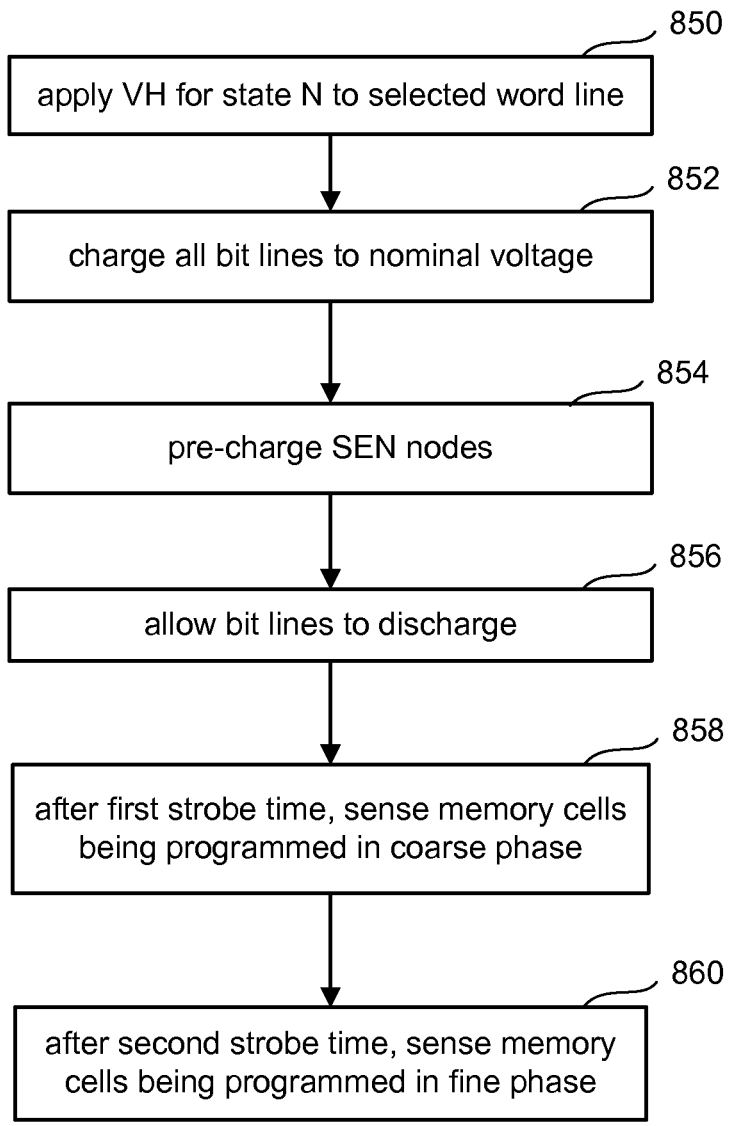
FIG. 17 is a flow chart describing one embodiment of a process for sensing.

While the embodiment of FIGS. 14 and 15 varied the bit line voltage to achieve concurrent sensing for different verify levels, the embodiments of FIGS. 16 and 17 vary the strobe time voltage to achieve sensing for different verify levels in response to a common word line voltage. Sensing at a shorter strobe time is effectively sensing the memory cell for a lower threshold voltage than the control gate (word line) voltage being applied. The processes of FIGS. 16 and 17 use this theory to adjust the strobe time so that for a set of memory cells being connected to a common bit line, some of the memory cells will be verified for VH of data state N and other memory cells will be verified for VL of data state N in response to the same word line/control gate voltage (verify reference voltage).

FIG. 16 is a flow chart describing one embodiment of a process of performing verification using the technology proposed herein, including the waveform of FIG. 13. The process of FIG. 16 is an example implementation of step 652 of FIG. 12B. In one embodiment, the process of FIG. 16 is performed between each set of successive programming pulses.

In step 802, the voltage S1VH is applied to the selected word. While S1VH is applied to the selected word line, the sense amplifier is used to sense after a first strobe time (e.g., 600 ns) whether the threshold voltages of a first subset of the memory cells connected to the selected word line that are in the coarse phase for data state S1 are above or below S1VL and after a second strobe time (e.g., 1000 ns) whether the threshold voltages of a second subset of the memory cells connected to the selected word line that are in the fine phase for data state S1 are above or below S1VH. Note that the first strobe time and the second strobe time overlap, meaning that both are occurring during at least one same time period. For example, the first strobe time and the second strobe time overlap if both start at the same time but end at different time; both start at different times but end at the same time; or both start and end at different time but are active at time T.

In step 804, the voltage S2VH is applied to the selected word. While S2VH is applied to the selected word line, the sense amplifier is used to sense after a first strobe time whether the threshold voltages of a first subset of the memory cells connected to the selected word line that are in the coarse phase for data state S2 are above or below S2VL and after a second strobe time whether the threshold voltages of a second subset of the memory cells connected to the selected word line that are in the fine phase for data state S2 are above or below S2VH.

In step 806, the voltage S3VH is applied to the selected word. While S3VH is applied to the selected word line, the sense amplifier is used to sense after a first strobe time whether the threshold voltages of a first subset of the memory cells connected to the selected word line that are in the coarse phase for data state S3 are above or below S3VL and after a second strobe time whether the threshold voltages of a second subset of the memory cells connected to the selected word line that are in the fine phase for data state S3 are above or below S3VH.

In step 808, the voltage S4VH is applied to the selected word. While S4VH is applied to the selected word line, the sense amplifier is used to sense after a first strobe time whether the threshold voltages of a first subset of the memory cells connected to the selected word line that are in the coarse phase for data state S4 are above or below S4VL and after a second strobe time whether the threshold voltages of a second subset of the memory cells connected to the selected word line that are in the fine phase for data state S4 are above or below S4VH.

In step 810, the voltage S5VH is applied to the selected word. While S5VH is applied to the selected word line, the sense amplifier is used to sense after a first strobe time whether the threshold voltages of a first subset of the memory cells connected to the selected word line that are in the coarse phase for data state S5 are above or below S5VL and after a second strobe time whether the threshold voltages of a second subset of the memory cells connected to the selected word line that are in the fine phase for data state S5 are above or below S5VH.

In step 812, the voltage S6VH is applied to the selected word. While S6VH is applied to the selected word line, the sense amplifier is used to sense after a first strobe time whether the threshold voltages of a first subset of the memory cells connected to the selected word line that are in the coarse phase for data state S6 are above or below S6VL and after a second strobe time whether the threshold voltages of a second subset of the memory cells connected to the selected word line that are in the fine phase for data state S6 are above or below S6VH.

In step 814, the voltage S7VH is applied to the selected word. While S7VH is applied to the selected word line, the sense amplifier is used to sense after a first strobe time whether the threshold voltages of a first subset of the memory cells connected to the selected word line that are in the coarse phase for data state S7 are above or below S7VL and after a second strobe time whether the threshold voltages of a second subset of the memory cells connected to the selected word line that are in the fine phase for data state S7 are above or below S7VH.

In step 816, the voltage S8VH is applied to the selected word. While S8VH is applied to the selected word line, the sense amplifier is used to sense after a first strobe time whether the threshold voltages of a first subset of the memory cells connected to the selected word line that are in the coarse phase for data state S8 are above or below S8VL and after a second strobe time whether the threshold voltages of a second subset of the memory cells connected to the selected word line that are in the fine phase for data state S8 are above or below S8VH.

In step 818, the voltage S9VH is applied to the selected word. While S9VH is applied to the selected word line, the sense amplifier is used to sense after a first strobe time whether the threshold voltages of a first subset of the memory cells connected to the selected word line that are in the coarse phase for data state S9 are above or below S9VL and after a second strobe time whether the threshold voltages of a second subset of the memory cells connected to the selected word line that are in the fine phase for data state S9 are above or below S9VH.

In step 820, the voltage S10VH is applied to the selected word. While S10VH is applied to the selected word line, the sense amplifier is used to sense after a first strobe time whether the threshold voltages of a first subset of the memory cells connected to the selected word line that are in the coarse phase for data state S10 are above or below S10VL and after a second strobe time whether the threshold voltages of a second subset of the memory cells connected to the selected word line that are in the fine phase for data state S10 are above or below S10VH.

In step 822, the voltage S11VH is applied to the selected word. While S11VH is applied to the selected word line, the sense amplifier is used to sense after a first strobe time whether the threshold voltages of a first subset of the memory cells connected to the selected word line that are in the coarse phase for data state S11 are above or below S11VL and after a second strobe time whether the threshold voltages of a second subset of the memory cells connected to the selected word line that are in the fine phase for data state S11 are above or below S11VH.

In step 824, the voltage S12VH is applied to the selected word. While S12VH is applied to the selected word line, the sense amplifier is used to sense after a first strobe time whether the threshold voltages of a first subset of the memory cells connected to the selected word line that are in the coarse phase for data state S12 are above or below S12VL and after a second strobe time whether the threshold voltages of a second subset of the memory cells connected to the selected word line that are in the fine phase for data state S12 are above or below S12VH.

In step 826, the voltage S13VH is applied to the selected word. While S13VH is applied to the selected word line, the sense amplifier is used to sense after a first strobe time whether the threshold voltages of a first subset of the memory cells connected to the selected word line that are in the coarse phase for data state S13 are above or below S13VL and after a second strobe time whether the threshold voltages of a second subset of the memory cells connected to the selected word line that are in the fine phase for data state S13 are above or below S13VH.

In step 828, the voltage S14VH is applied to the selected word. While S14VH is applied to the selected word line, the sense amplifier is used to sense after a first strobe time whether the threshold voltages of a first subset of the memory cells connected to the selected word line that are in the coarse phase for data state S14 are above or below S14VL and after a second strobe time whether the threshold voltages of a second subset of the memory cells connected to the selected word line that are in the fine phase for data state S14 are above or below S14VH.

In step 830, the voltage S15VH is applied to the selected word. While S15VH is applied to the selected word, the sense amplifier is used to sense whether the threshold voltages of the memory cells connected to the selected word line and being programmed to data state S15 are above or below S15VH. In one embodiment, memory cells being programmed to data state S15 are not subjected to coarse/fine programming.

The process of FIG. 16 can be performed at the direction of state machine 112 and/or controller 122. For example, in one embodiment, state machine 112 (or controller 122) will direct decoders 114/124/132, power control module 116, sense blocks SB1, SB2, . . . , SBp, and read/write circuits 128 to perform the functions described in FIG. 16.

FIG. 17 is a flow chart describing a single strobe sensing operation performed during each of steps 802-828. In step 850, the appropriate data state N verify reference voltage VH (e.g., S1VH, S2VH, S3VH, S4VH, S5VH, S6VH, S7VH, S8VH, S9VH, S10VH, S13VH, S12VH, S13VH, and S14VH) is applied is applied to the selected word line. In step 852, all bit lines are charged to the nominal bit line voltage (e.g., 0.7 volts). In step 854, the SEN nodes of the sense amplifiers are simultaneously pre-charged, as discussed above. In step 856, the capacitors at the SEN nodes have the opportunity to discharge through the memory cells (see capacitor 516 at t5-t6 of FIG. 6), as discussed above. In step 858, after the first strobe time, the voltage of the capacitor 516 (or the SEN node) is sampled as described above to see whether the respective memory cell(s) in the coarse phase conducted so that the memory cells are sensed for VL of state N. In step 860, after the second strobe time (which is longer than the first strobe time), the voltage of the capacitor 516 (or the SEN node) is sampled as described above to see whether the respective memory cell(s) in the fine phase conducted so that the memory cells are sensed for VH of state N. Regardless of whether the respective memory cells are in the coarse phase or fine phase, their respective SEN nodes and capacitors 516 are charged at the same time and discharged concurrently. The term "concurrently" is used to indicate that the multiple actions occur at overlapping times, for example, they start at the same time but may end at different times.

Figure 18:
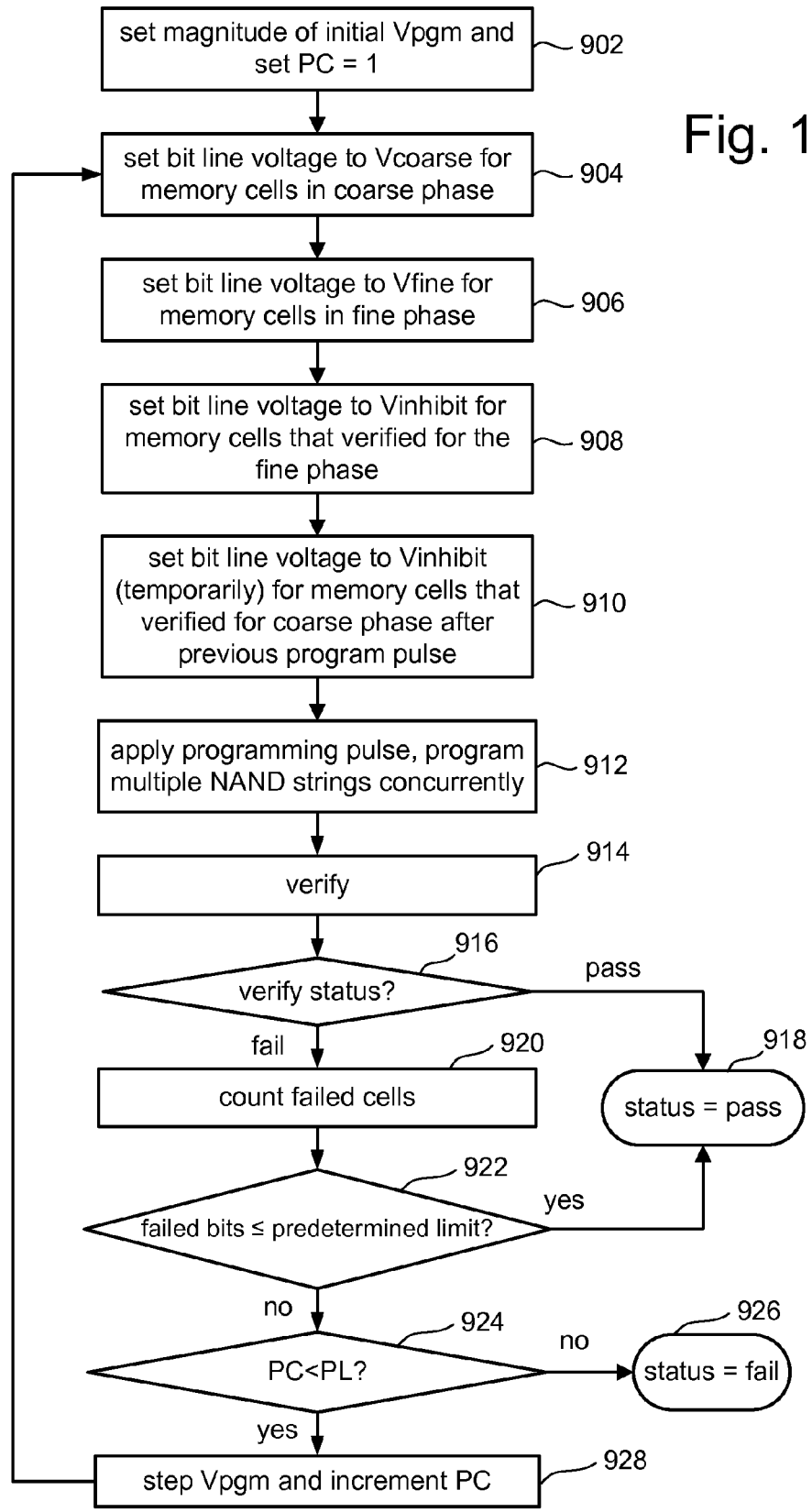
FIG. 18 is a flow chart describing one embodiment of a process for programming.

FIG. 18 is a flow chart describing one embodiment of a process for performing programming on memory cells connected to a common word line to one or more targets (e.g., data states or threshold voltage ranges). The process of FIG. 18 can be performed one or multiple times to program data to a set of memory cells. For example, the process of FIG. 18 can be used to program memory cells from S0 to any of S1-S15 in the full sequence programming of FIG. 8A. The process of FIG. 18 can be used to program memory cells for any of the three stages of FIGS. 9A-C. The process of FIG. 18 is one example implementations of the method of FIG. 12B that can utilize the waveform of FIG. 13.

In step 902 of FIG. 18, the programming voltage (Vpgm) is initialized to the starting magnitude (e.g., ~12-16V or another suitable level) and a program counter PC maintained by state machine 112 is initialized at 1. In step 772, a program pulse of the program signal Vpgm is applied to the selected word line (the word line selected for programming). In one embodiment, the group of memory cells being programmed concurrently are all connected to the same word line (the selected word line). The unselected word lines receive one or more boosting voltages (e.g., ~7-11 volts) to perform boosting schemes known in the art. If a memory cell should be programmed, then the corresponding bit line is grounded. On the other hand, if the memory cell should remain at its current threshold voltage, then the corresponding bit line is connected to Vdd to inhibit programming.

Steps 904-910 are used to set the bit line voltages, as per the discussion above. In step 904, the bit line voltage for memory cells in the coarse phase is set to Vcoarse, which is the bit line voltage that allows for programming in the coarse phase. In one embodiment, Vcoarse is 0v. In step 906, the bit line voltage for memory cells in the fine phase is set to Vfine, which the bit line voltage that allows for programming in the fine phase. In one embodiment, Vfine can be typically in the order of 0.3v to 0.8v. In step 908, the bit line voltage is set to Vinhibit for memory cells that have successfully verified for the fine stage so that these memory cells will be stopped from further programming. In one embodiment, Vinhibit is set at Vdd, which is typically 2.5-5v. Note also that "inhibited from further programming" is with respect to the current programming process. In the future, the block of memory cells can be erased and programmed again. In step 910, the bit line voltage is set to Vinhibit for memory cells that successfully verified for the coarse stage after the immediately preceding programming pulse so that programming is temporarily stopped for these memory cells for the next programming pulse. This allows for the memory cells to be verified for VH before any additional programming, which prevents over programming.

In step 912, the programming pulse is concurrently applied to all memory cells connected to the selected word line so that all of the memory cells connected to the selected word line are potentially programmed concurrently. That is, they are programmed at the same time or during overlapping times (both of which are considered concurrent). In this manner all of the memory cells connected to the selected word line will concurrently have their threshold voltage change, unless they have been inhibited from programming. In step 914, the appropriate memory cells are verified using the appropriate set of target levels to perform one or more verify operations. The processes of FIGS. 14-17 can be used to implement the verify process of step 914. In step 916, it is determined whether all the memory cells have reached their target threshold voltages (pass). If so, the programming process is complete and successful because all selected memory cells were programmed and verified to their target states. A status of "PASS" is reported in step 918. If, in step 916, it is determined that not all of the memory cells have reached their target threshold voltages (fail), then the programming process continues.

In step 920, the system counts the number of memory cells that have not yet reached their respective target threshold voltage distribution. That is, the system counts the number of memory cells that have failed the verify process. This counting can be done by the state machine, the controller, or other logic. In one implementation, each of the sense blocks will store the status (pass/fail) of their respective cells. In one embodiment, there is one total count, which reflects the total number of memory cells currently being programmed that have failed the last verify step. In another embodiment, separate counts are kept for each data state. In step 922, it is determined whether the count from step 920 is less than or equal to a predetermined limit. In one embodiment, the predetermined limit is the number of bits that can be corrected by ECC during a read process for the page of memory cells. If the number of failed cells is less than or equal to the predetermined limit, than the programming process can stop and a status of "PASS" is reported in step 918. In this situation, enough memory cells programmed correctly such that the few remaining memory cells that have not been completely programmed can be corrected using ECC during the read process. In some embodiments, step 920 will count the number of failed cells for each sector, each target data state or other unit, and those counts will individually or collectively be compared to a threshold in step 922. In another embodiment, the predetermined limit can be less than the number of bits that can be corrected by ECC during a read process to allow for future errors. When programming less than all of the memory cells for a page, or comparing a count for only one data state (or less than all states), than the predetermined limit can be a portion (pro-rata or not pro-rata) of the number of bits that can be corrected by ECC during a read process for the page of memory cells. In some embodiments, the limit is not predetermined Instead, it changes based on the number of errors already counted for the page, the number of program-erase cycles performed or other criteria.

If number of failed memory cells is not less than the predetermined limit, than the programming process continues at step 924 and the program counter PC is checked against the program limit value (PL). Examples of program limit values include 20 and 30; however, other values can be used. If the program counter PC is not less than the program limit value PL, then the program process is considered to have failed and a status of FAIL is reported in step 926. If the program counter PC is less than the program limit value PL, then the process continues at step 928 during which time the Program Counter PC is incremented by 1 and the program voltage Vpgm is stepped up to the next magnitude. For example, the next pulse will have a magnitude greater than the previous pulse by a step size (e.g., a step size of 0.1-0.4 volts). After step 928, the process loops back to step 904 so that the bit lines can be set and another program pulse is applied to the selected word line.

The process of FIG. 18 can be performed at the direction of state machine 112 and/or controller 122. For example, in one embodiment, state machine 112 (or controller 122) will direct decoders 114/124/132, power control module 116, sense blocks SB1, SB2, . . . , SBp, and read/write circuits 128 to perform the functions described in FIG. 18.

Figure 19:
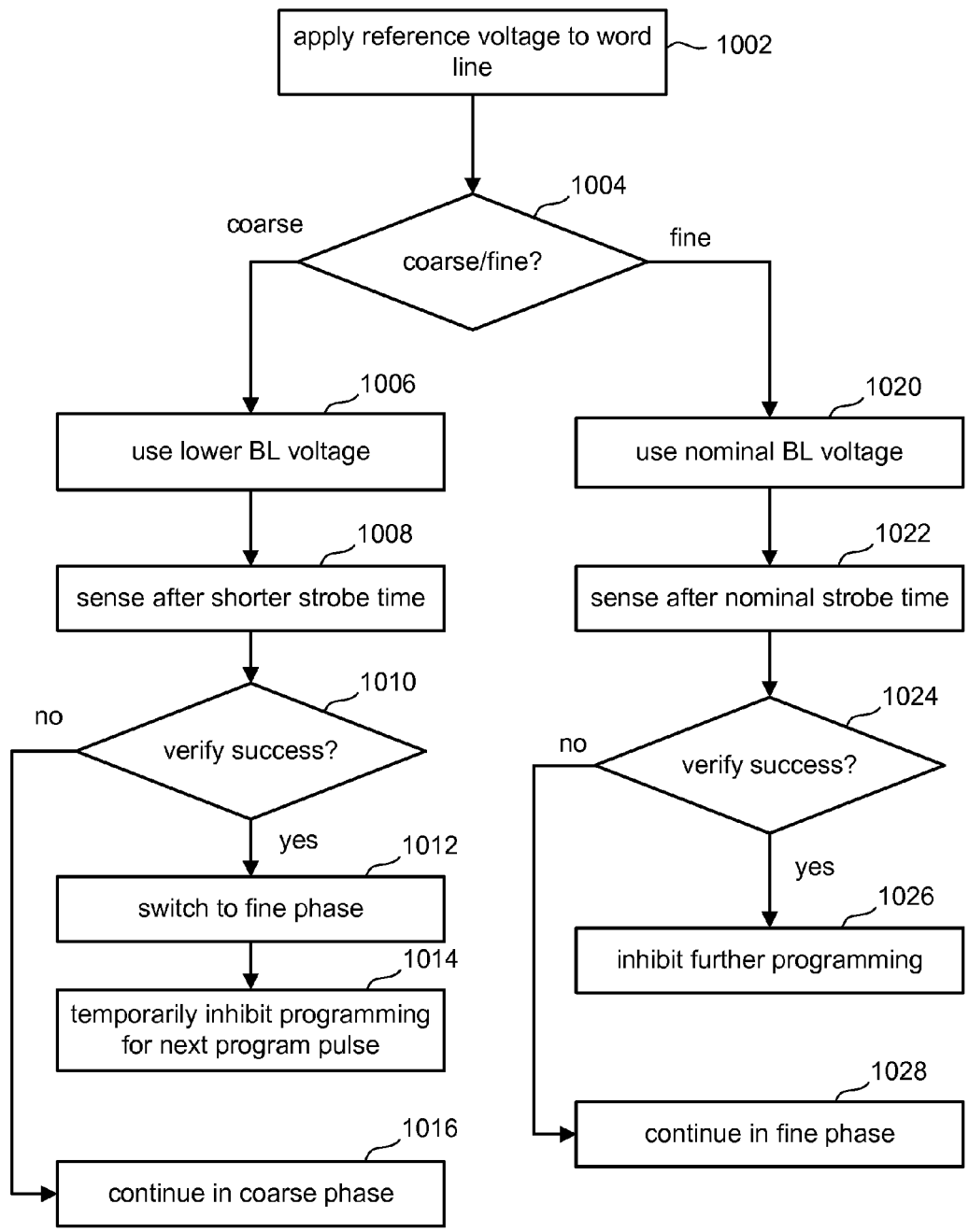
FIG. 19 is a flow chart describing one embodiment of a process performed during verification.

FIG. 19 is a flow chart describing one embodiment of a verification process performed for a memory cell. In one embodiment, the process of FIG. 19 is performed for each memory cell being programmed during step 914 of FIG. 18, and can be used to implement the processes of FIGS. 14 and/or 16. The processes of FIGS. 14 and 16 are at the system level, while the process of FIG. 19 is at the memory cell level.

In step 1002, the appropriate reference voltage for state N is applied to the word line. If the memory cell is currently in the coarse phase (step 1004) of the programming process, then the lower bit line voltage VBLC_VL will be applied for the sensing operation (step 1006). In step 1008, the sensing operation is performed (see discussion above), and the memory cell is sensed after the shorter strobe time. If implementing the process of FIG. 14 (using different bit line voltages) and not using different strobe times, then step 1008 will sense after the nominal strobe time. However, in another embodiment, the system will implement the multiple bit line voltages of FIG. 14 and the multiple strobe times of FIG. 16 so that step 1006 will be implemented using the lower bit line voltage and step 1008 will be implemented with sensing after the shorter strobe time. In another embodiment that implements the different strobe times of FIG. 16, but not the different bit line voltage of FIG. 14, them step 1006 will include applying the nominal bit line voltage. If verification is successful (step 1010), then the memory cell is switched to the fine phase of programming in step 1012. In step 1014, the system temporarily inhibits programming for the memory cell for the next program pulse (see step 910 of FIG. 18). If verification was not successful (step 1010), then the memory cell continues in the coarse phase (step 1016).

If the memory cell is in the fine phase (step 1004), then the nominal bit line voltage VBLC_VH is applied for the sensing, as discussed above. In step 1022, the system sense after the nominal strobe time. If verification was successful (step 1024), then the memory cell is inhibited from further programming (step 1026). If verification was not successful, then the memory cell continues in the fine phase (step 1028).

The process of FIG. 19 can be performed at the direction of state machine 112 and/or controller 122. For example, in one embodiment, state machine 112 (or controller 122) will direct power control module 116, sense blocks SB1, SB2, . . . , SBp, and read/write circuits 128 to perform the functions described in FIG. 19.

Figure 20:
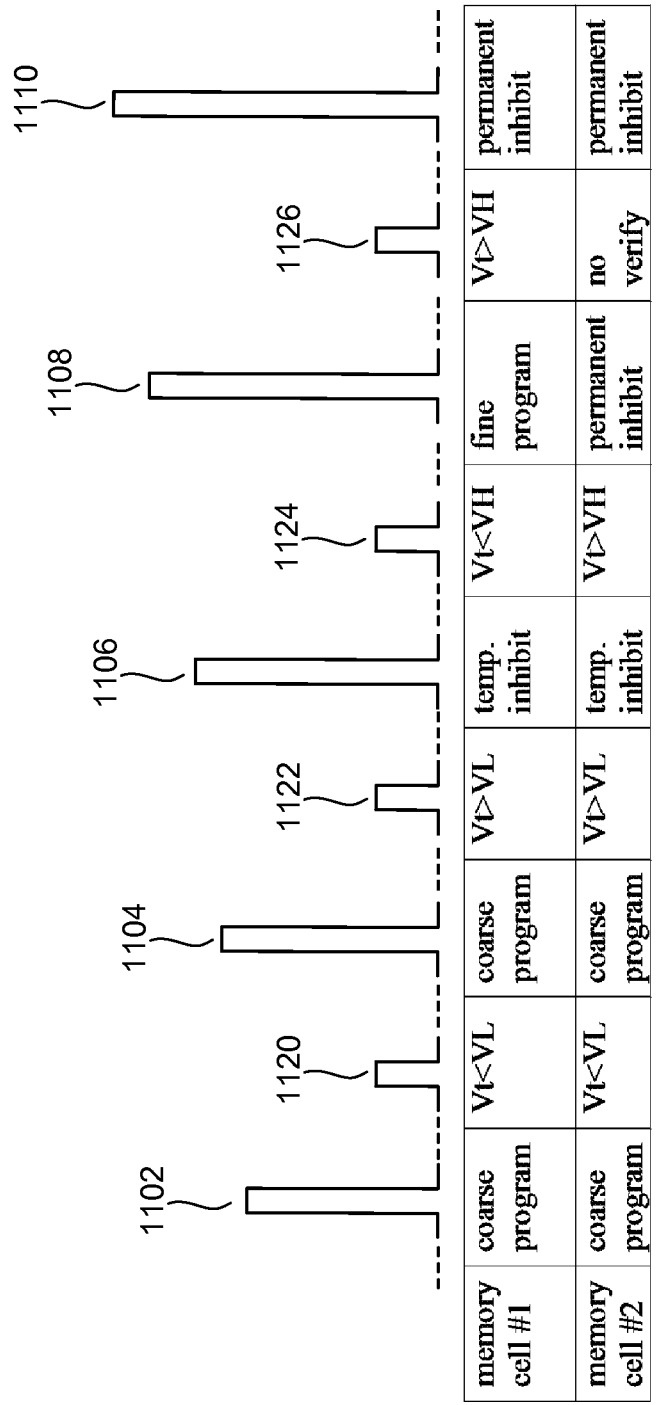
FIG. 20 shows an example waveform and explains behavior of two example memory cells.

FIG. 20 shows an example waveform applied to the selected word line and explains the behavior of two example memory cells. Each of the two memory cells (memory cell #1 and memory cell #2) can represent a group or plurality of memory cells. The waveform of FIG. 20 shows programming pulses 1102, 1104, 1106, 1108 and 1110. The waveform also shows verification pulses 1120, 1122, 1124, 1126. The programming pulses increase in magnitude with each successive pulse. The verification pulses are for the same data state and, therefore, do not increase in magnitude. Note that FIG. 20 shows ellipses between the program pulses and verification pulses to indicate that there will likely be multiple verification pulses between each program pulse, for the different data states. However, FIG. 20 only shows the same verification pulse for the same data state between each program pulse because the two memory cells (memory cell #1 and memory cell #2) are being verified to the same data state and will only be verified based on the same verification pulse for the same data state.

Below the waveform of FIG. 20 are two rows of boxes. The top row of boxes explains the behavior of memory cell #1 during the pulse above the respective box. The bottom row of boxes explains the behavior of memory cell #2 during the pulse depicted above the respective box. During programming pulse 1102, both memory cell #1 and memory cell #2 are in the coarse program phase. In response to the reference voltage (the magnitude of verify pulse 1120), memory cell #1 and memory #2 are verified and it is determined that both have threshold voltages less than the coarse phase verify level VL for the data state N. Therefore, both memory cells remain in the coarse programming phase (see steps 1010 and 1016 of FIG. 19). During programming pulse 1104, both memory cell #1 and memory cell #2 receive programming in the coarse phase. In response to the reference voltage provided by verify pulse 1122, it is determined that both memory cell #1 and memory cell #2 have the threshold voltages greater than the coarse phase verify level VL for the data state N. Therefore, both memory cells will switch to the fine phase (step 1012 of FIG. 19) and will be temporarily inhibited from programming for the next program pulse (step 1014 of FIG. 19). That is, a larger bit line voltage (e.g. Vinhibit) will be applied to the respective bit line so that, even though the memory cells will receive the programming pulse, the threshold voltage for the memory cells will not change. In response to verify pulse 1124, both memory cells will be verified for verify level VH for data state N. Note that the verify pulses applied to the memory cells have the same magnitude, regardless of whether the memory cells are being verified against VL or VH. In response to the verification performed in conjunction with verify pulse 1124, it is determined that the threshold voltage of memory cell #1 remains below VH, while the threshold voltage of memory cell #2 exceeds VH. Therefore, memory cell #1 will continue in the fine phase (step 1028 of FIG. 19), while memory cell #2 will be inhibited from further programming (step 1026 of FIG. 19). During program pulse 1108, memory cell #1 will be experiencing fine phase programming, while memory cell #2 will be inhibited. In response to verify pulse 1126, memory cell #1 will be verified against VH for data state N, while memory cell #2 will not be verified. It is determined that the threshold voltage of memory cell #1 is greater than VH; therefore, memory cell #1 will be inhibited from further programming.

In one embodiment, the bit line voltage applied during the second programming pulse (ie programming pulse 1108) will be 0.9 v higher than normal because the memory cell skipped a programming pulse, thereby, causing the memory cell to experience a larger than typical increase in magnitude between programming pulses. Increasing the bit line voltage by 0.9 v above the normal VBLC_VL for one programming pulse will reduce the chance of over programming as the programming will be slowed for that one pulse.

FIGS. 21A-D are tables that explain the behavior of example memory cells. The table of FIG. 21A explains the behavior for memory cell #1 of FIG. 20. The table of FIG. 21B explains the behavior of memory cell #2 of FIG. 20. Each of the tables includes four columns. The left hand column indicates a program pulse number, the column second from the left indicates the bit line voltage during a program pulse, the third column indicates the bit line voltage during a verify operation, and the right hand column indicates the result of the respective verify process.

Considering FIG. 21A, the memory cell starts out in coarse programming phase until verification passes after pulse N. During the coarse programming phase, the bit line voltage during a program pulse will be Vcoarse. The bit line voltage during a verify operation will be VBLC_VL. After passing coarse verify (ie the threshold voltage Vt is greater than VH), the memory cell will be inhibited for the next programming pulse by applying Vinhibit to the bit line during the next programming pulse (N+1). For the remainder of the verify operations, the bit line will be VBLC_VH during verify operations and Vfine during program pulses. As can be seen, the memory cell will need multiple programming pulses to complete the fine phase, and ultimately will pass the verify process for the fine phase after program pulse #M.

The memory cell of table in FIG. 21B will pass the verify operation for the coarse phase after programming pulse N. During the program pulse N+1, which is immediately after passing verification for the coarse phase, the memory cell will be inhibited from programming by applying Vinhibit to the bit line. During the immediately subsequent verify operation for the fine phase, the memory cell will pass verification; therefore, the memory cell will be inhibited from further programming. This is a situation where the memory cell has its threshold voltage exceeding VL and VH in response to programming pulse N. In some embodiment, different memory cells can be in the fine phase while other memory cells are still in the coarse phase. The system is configured to verify a first subset of the memory cells for the coarse phase verify level VL and verify the second subset of the memory cells for the fine phase verify level VH by performing a sensing process that comprises (1) applying a reference voltage on the common word line to all of the memory cells being programmed; and (2) [a] sensing after applying a first bit line voltage to the first subset of the memory cells while applying a second bit line voltage to the first subset of the memory cells, or (2) [b] sensing the first subset of the memory cells in response to the reference voltage after a first strobe time and sensing the second subset of the memory cells after a second strobe time.

The embodiment described above with respect to FIGS. 21A and 21B includes the feature of inhibiting a memory cell from programming during the programming pulse immediately following successful verification during the coarse phase. This feature is to prevent over programming. In some embodiments, to speed up programming, the memory cell will not be inhibited in the program pulse following successful verification during the coarse phase. Such an embodiment would accept the risk of over programming and/or would set the bit line voltage or the magnitude of programming pulses accordingly to reduce the risk of over programming. The embodiments that do not inhibit programming during the programming pulse following successful verification during the coarse phase can make use of the technique for varying the bit line voltage described in FIG. 14 and/or the technique for varying the strobe time described in FIG. 16. The table of FIG. 21C corresponds to memory cell #1 of FIG. 20. The table of FIG. 21D corresponds to memory cell #2 of FIG. 20.

In the example of FIG. 21C, the memory cell passes coarse verify after programming pulse N. During coarse verify the memory cell receives Vcoarse on its bit line during programming and VBLC_VL on its bit line during verify. In the program pulse immediately after successfully verifying the coarse phase (programming pulse N+1) the bit line receives Vfine during programming pulses until the memory cell successfully verifies for the fine phase and the memory cell receives VBLC_VH on its bit line during the verify operation. In the example of FIG. 21C, the memory cell will need several programming pulses, until programming pulse M, to pass verification for the fine phase. Afterwards, the memory cell will be inhibited from further programming by asserting Vinhibit on its bit line.

In the example of FIG. 21D, the memory cell has Vcoarse applied to its bit line during programming pulses and VBLC_VL applied to its bit line during verify operations. The memory cell of FIG. 21D passes the coarse phase of programming after programming pulse N. During the next programming pulse N+1, the bit line for that memory cell will receive Vfine and during the subsequent verify operation the bit line will receive VBLC_VH. In the verification operation performed after programming pulse N+1, the memory cell will pass because, as discussed above, the memory cell's threshold voltage is greater than VH (in fact it was greater than VH after programming pulse N). Therefore, the memory cell will be inhibited from programming by applying Vinhibit to its bit line during all subsequent programming pulses for this programming process.

One embodiment includes an apparatus comprising: a plurality of memory cells; and one or more control circuits in communication with the memory cells. The one or more control circuits configured to apply a series of doses of programming to the memory cells. The one or more control circuits configured to sense (e.g., verify) a first subset of the memory cells for a first verify level for a target data state and sense (e.g., verify) a second subset of the memory cells for a second verify level for the target data state between doses of programming. For a memory cell sensed to have reached the first phase verify level the one or more control circuits are configured to temporarily inhibit programming for a subsequent dose of programming and add the memory cell to the second subset. For a memory cell sensed to have reached the second phase verify level the one or more control circuits are configured to inhibit further programming.

One embodiment includes an apparatus comprising: a plurality of memory cells; a programming circuit in communication with the memory cells, the programming circuit configured to apply a series of programming pulses to the memory cells; a verification circuit configured to detect a first subset of the memory cells having a threshold voltage that satisfies a first voltage level and a second subset of the memory cells having a threshold voltage that satisfies a second voltage level between programming pulses; and a lockout circuit configured to stop programming of the second subset of memory cells during subsequent programming pulses in the series and stop programming of the first subset of memory cells during at least one subsequent programming pulse in the series.

One embodiment includes a method, comprising: (a) applying a programming pulse to a first memory cell; (b) verifying the first memory cell for a first verify level for a target data state; (c) if the first memory cell has not reached the first verify level for the target data state, repeating (a)-(c); (d) if the first memory cell reaches the first verify level for the target data state, a and inhibiting the first memory cell from programming for a next programming pulse; (e) verifying the first memory cell for a second phase level for the target data state; (f) if the first memory cell reaches the second verify level for the target data state, inhibiting the first memory cell from programming; and (g) if the first memory cell has not reached the second verify level for the target data state, applying the next programming pulse to the first memory cell without inhibiting the first memory cell from programming and repeating (e)-(g).

One embodiment includes an apparatus, comprising: a plurality of memory cells arranged in a three dimensional memory structure; and means for performing two phased programming for the memory cells, to verify programming the means for performing two phased programming is configured by apply a reference voltage to the memory cells and sense whether different memory cells of the plurality of memory cells have reached different verify levels for a data state in response to the reference voltage by applying different bit line voltages to different bit lines connected to the different memory cells.

One example implementation further comprises a common word line connected to each memory cell of the plurality of memory cells, the means for performing two phased programming applies the reference voltage to the memory cells by driving the reference voltage on the common word line. In one embodiment, the means for performing two phased programming is configured to sense whether different memory cells of the plurality of memory cells are in different data states by applying a first bit line voltage to a first subset of bit lines connected to a first subset of the memory cells, applying a second bit line voltage to a second subset of bit lines connected to a second subset of the memory cells, sensing whether the first subset of the memory cells have threshold voltages greater than a first verify level for the data state in response to the reference voltage and the first bit line voltage, and sensing whether the second subset of the memory cells have threshold voltages greater than a second verify level for the data state in response to the first reference voltage and the second bit line voltage. In one embodiment, the means for performing two phased programming performs the sensing of whether the first subset of the memory cells have threshold voltages greater than the first verify level concurrently with the sensing of whether the second subset of the memory cells have threshold voltages greater than the second verify level.

For purposes of this document, it should be noted that the dimensions of the various features depicted in the figures may not necessarily be drawn to scale.

For purposes of this document, reference in the specification to "an embodiment," "one embodiment," "some embodiments," or "another embodiment" may be used to describe different embodiments or the same embodiment.

For purposes of this document, a connection may be a direct connection or an indirect connection (e.g., via one or more others parts). In some cases, when an element is referred to as being connected or coupled to another element, the element may be directly connected to the other element or indirectly connected to the other element via intervening elements. When an element is referred to as being directly connected to another element, then there are no intervening elements between the element and the other element. Two devices are "in communication" if they are directly or indirectly connected so that they can communicate electronic signals between them.

For purposes of this document, the term "based on" may be read as "based at least in part on."

For purposes of this document, without additional context, use of numerical terms such as a "first" object, a "second" object, and a "third" object may not imply an ordering of objects, but may instead be used for identification purposes to identify different objects.

For purposes of this document, the term "set" of objects may refer to a "set" of one or more of the objects.

The foregoing detailed description has been presented for purposes of illustration and description. It is not intended to be exhaustive or to limit to the precise form disclosed. Many modifications and variations are possible in light of the above teaching. The described embodiments were chosen in order to best explain the principles of the proposed technology and its practical application, to thereby enable others skilled in the art to best utilize it in various embodiments and with various modifications as are suited to the particular use contemplated. It is intended that the scope be defined by the claims appended hereto.

What is claimed is:

1. An apparatus, comprising:
   a plurality of memory cells; and
   one or more control circuits in communication with the memory cells, the one or more control circuits configured to apply a series of doses of programming to the memory cells, the one or more control circuits configured to sense a first subset of the memory cells for a first verify level for a target data state and sense a second subset of the memory cells for a second verify level for the target data state between doses of programming, for a memory cell sensed to have reached the first verify level the one or more control circuits are configured to temporarily inhibit programming for a subsequent dose of programming and add the memory cell to the second subset, for a memory cell sensed to have reached the second verify level the one or more control circuits are configured to inhibit further programming.

2. The apparatus of claim 1, wherein:
   the series of doses of programming are part of a multi-phased programming process that includes a coarse phase and a fine phase.

3. The apparatus of claim 2, wherein:
   the first verify level is a threshold voltage reference for the coarse phase;
   the second verify level is a threshold voltage reference for the fine phase, the second verify level is higher in magnitude than the first verify level;
   the doses of programming include a series of programming pulses that cause an increase in threshold voltage for at least a subset of the memory cells;
   the one or more control circuits are configured to apply a voltage to memory cells in the fine phase in order to slow down programming;
   memory cells being programmed by the multi-phased programming process start in the coarse phase and move to the fine phase when their respective threshold voltage is detected to be higher than the first verify level and lower than the second verify level;
   the one or more control circuits are configured to apply an intermediate bit line voltage to memory cells in the fine phase in order to slow down any increase in threshold voltage;
   the one or more control circuits are configured to apply a inhibit bit line voltage to a particular memory cell in order to inhibit further programming when the particular memory cell's threshold voltage is detected to be higher than the second verify level; and for the memory cell verified to have reached the first verify level the one or more control circuits are configured to temporarily inhibit programming for a next programming pulse and add the memory cell to the second subset.

4. The apparatus of claim 1, wherein:
the one or more control circuits are configured to sense the first subset of the memory cells for the first verify level concurrently with sensing the second subset of the memory cells for the second verify level.

5. The apparatus of claim 1, wherein:
the one or more control circuits are configured to sense the first subset of the memory cells for the first verify level and sense the second subset of the memory cells for the second verify level by applying a first bit line voltage to the first subset of the memory cells while applying a second bit line voltage to the second subset of the memory cells during a sensing process.

6. The apparatus of claim 1, wherein:
the memory cells are connected to a common word line; and
the one or more control circuits are configured to sense the first subset of the memory cells for the first verify level and sense the second subset of the memory cells for the second verify level while applying a reference voltage to the common word line during a sensing process.

7. The apparatus of claim 6, wherein:
the one or more control circuits are configured to sense the first subset of the memory cells for the first verify level and sense the second subset of the memory cells for the second verify level by applying a first bit line voltage to the first subset of the memory cells while applying a second bit line voltage to the first subset of the memory cells during the sensing process and while applying the reference voltage to the common word line, the one or more control circuits are configured to sense the first subset of the memory cells in response to the reference voltage and the first bit line voltage, the one or more control circuits are configured to sense the second subset of the memory cells in response to the reference voltage and the second bit line voltage.

8. The apparatus of claim 1, wherein:
the one or more control circuits are configured to sense the first subset of the memory cells for the first verify level state and sense the second subset of the memory cells for the second verify level by performing a sensing process that comprises the one or more control circuits applying a reference voltage to the first subset of the memory cells and the second subset of the memory cells, sensing the first subset of the memory cells in response to the reference voltage after a first strobe time and sensing the second subset of the memory cells after a second strobe time, the first strobe time and the second strobe time overlap, the first strobe time and the second strobe time are different.

9. The apparatus of claim 1, wherein:
for the memory cell sensed to have reached the first verify level the one or more control circuits are configured to temporarily inhibit programming for multiple doses of programming; and
the one or more control circuits are configured to apply additional doses programming to at least some of the memory cells added to the second subset until the second verify level is met.

10. An apparatus according to claim 1, wherein:
the memory cells are in a three dimensional memory structure.

11. An apparatus, comprising:
a plurality of memory cells;
a programming circuit in communication with the memory cells, the programming circuit configured to apply a series of programming pulses to the memory cells;
a verification circuit configured to detect a first subset of the memory cells having a threshold voltage that satisfies a first voltage level and a second subset of the memory cells having a threshold voltage that satisfies a second voltage level between programming pulses; and
a lockout circuit configured to stop programming of the second subset of memory cells during subsequent programming pulses in the series and stop programming of the first subset of memory cells during at least one subsequent programming pulse in the series.

12. The apparatus of claim 11, wherein:
memory cells in the first subset are distinct from memory cells in the second subset.

13. The apparatus of claim 11, wherein the verification circuit comprises:
a low threshold voltage lockout circuit configured to stop programming of the first subset of memory cells during at least one subsequent programming pulse in the series; and
a high threshold voltage lockout circuit configured to stop programming of the second subset of memory cells during subsequent programming pulses in the series.

14. A method, comprising:
(a) applying a programming pulse to a first memory cell;
(b) verifying the first memory cell for a first verify level for a target data state;
(c) if the first memory cell has not reached the first verify level for the target data state, repeating (a)-(c);
(d) if the first memory cell reaches the first verify level for the target data state, inhibiting the first memory cell from programming for the next programming pulse;
(e) verifying the first memory cell for a second verify level for the target data state;
(f) if the first memory cell reaches the second verify level for the target data state, inhibiting the first memory cell from programming; and
(g) if the first memory cell has not reached the second verify level for the target data state, applying the next programming pulse to the first memory cell with a bit line voltage without inhibiting the first memory cell from programming and repeating (e)-(g).

15. A method according to claim 14, wherein:
the applying a programming pulse to the first memory cell includes applying a first bit line voltage to a bit line connected to the first memory cell;
the applying the next programming pulse to the first memory cell without inhibiting the first memory cell from programming includes applying a second bit line voltage to the bit line to slow down programming, the second bit line voltage is higher than the first bit line voltage; and
the inhibiting the first memory cell from programming includes applying a third bit line voltage to the bit line, the third bit line voltage that is higher than the second bit line voltage.

16. A method according to claim 14, wherein:
the verifying the first memory cell for the first verify level for the target data state comprises applying a reference voltage to a word line connected to the first memory cell, applying a first bit line voltage to a bit line connected to the first memory cell and sensing in response to the reference voltage and first bit line voltage; and the verifying the first memory cell for the second verify level for the target data state comprises applying the reference voltage to the word line connected to the first memory cell, applying a second bit line voltage to the bit line connected to the first memory cell and sensing in response to the reference voltage and second bit line voltage.

17. A method according to claim 14, wherein:

the verifying the first memory cell for the first verify level for the target data state comprises applying a reference voltage to a word line connected to the first memory cell and sensing in response to the reference voltage after a first strobe; and the verifying the first memory cell for the second verify level for the target data state comprises applying the reference voltage to the word line connected to the first memory cell and sensing in response to the reference voltage after a second strobe time, the first strobe time and the second strobe time are different and overlap.

18. A method according to claim 14, wherein:

the verifying the first memory cell for the first verify level for the target data state comprises applying a reference voltage to a word line connected to the first memory cell, applying a first bit line voltage to a bit line connected to the first memory cell and sensing in response to the reference voltage and first bit line voltage after a first strobe time; and the verifying the first memory cell for the second verify level for the target data state comprises applying the reference voltage to the word line connected to the first memory cell, applying a second bit line voltage to the bit line connected to the first memory cell and sensing in response to the reference voltage and second bit line voltage after a second strobe time, the first strobe time and the second strobe time are different and overlap.

19. A method according to claim 14, wherein:

the verifying the first memory cell for the first verify level for the target data state is performed concurrently with verifying a second memory cell for the second verify level for the target data state, while both the first memory cell and the second memory cell receive a common reference voltage.

20. A method according to claim 14, wherein:

the inhibiting the first memory cell from programming for the next programming pulse is performed concurrently with allowing a second memory cell to program during the next program pulse, both the first memory cell and the second memory cell receive the next program pulse.

21. An apparatus, comprising:

a plurality of memory cells arranged in a three dimensional memory structure;

means for performing two phased programming for the memory cells by applying a series of programming pulses to the memory cells;

means for detecting between programming pulses whether a first subset of the memory cells have threshold voltages that satisfy a first voltage level for a first phase and whether a second subset of the memory cells have threshold voltages that satisfy a second voltage level for a second phase; and means for temporarily inhibiting programming for a subsequent programming pulse memory cells of the first subset that have threshold voltages that satisfy the first voltage level and for inhibiting programming memory cells of the second subset that have threshold voltages that satisfy the second voltage level.

* * * * *